(12) United States Patent
Plester et al.

(10) Patent No.: US 6,447,837 B2
(45) Date of Patent: Sep. 10, 2002

(54) METHODS FOR MEASURING THE DEGREE OF IONIZATION AND THE RATE OF EVAPORATION IN A VAPOR DEPOSITION COATING SYSTEM

(75) Inventors: George Plester, Brussels (BE); Horst Ehrich, Dorsten (DE)

(73) Assignee: The Coca-Cola Company, Atlanta, GA (US)

( * ) Notice: Subject to any disclaimer, the term of this patent is extended or adjusted under 35 U.S.C. 154(b) by 0 days.

(21) Appl. No.: 09/845,885

(22) Filed: Apr. 30, 2001

Related U.S. Application Data

(62) Division of application No. 09/128,456, filed on Aug. 3, 1998, now Pat. No. 6,251,233.

(51) Int. Cl.[7] .................................................. B05D 1/00
(52) U.S. Cl. ........................ 427/8; 427/10; 204/192.13; 204/298.03; 118/712
(58) Field of Search ....................... 204/192.13, 298.03; 118/712; 427/8, 10

(56) References Cited

U.S. PATENT DOCUMENTS

| | | | |
|---|---|---|---|
| 2,664,852 A | 1/1954 | Chadsey, Jr. ................. | 118/718 |
| 2,665,226 A | 1/1954 | Godley, Jr. et al. ......... | 427/250 |
| 2,996,037 A | 8/1961 | Eng ............................ | 118/718 |
| 3,016,873 A | 1/1962 | Baer et al. .................. | 118/726 |
| 3,511,703 A | 5/1970 | Peterson ..................... | 438/778 |
| 3,625,848 A | 12/1971 | Snapper ................... | 204/192.38 |
| 4,024,399 A | * 5/1977 | Janes et al. .................. | 250/300 |
| 4,230,068 A | 10/1980 | Itoh et al. ................... | 118/634 |
| 4,438,368 A | 3/1984 | Abe et al. ...................... | 315/39 |
| 4,448,802 A | 5/1984 | Buhl et al. .................. | 427/580 |

(List continued on next page.)

FOREIGN PATENT DOCUMENTS

| | | |
|---|---|---|
| DE | 1521421 | 12/1969 |
| DE | 3239131 A1 | 4/1984 |
| DE | 4026494 C2 | 5/1992 |
| DE | 42 03 371 C1 | 2/1993 |
| DE | 40 06 457 C2 | 9/1993 |

(List continued on next page.)

OTHER PUBLICATIONS

G.I. Deak and S.C. Jackson; *Mylar Polyester Films With Inorganic Glass Coatings*; Du Pont Company, Wilmington, DE, pp. 318–333.

*Primary Examiner*—Rodney G. McDonald
(74) *Attorney, Agent, or Firm*—Sutherland Asbill & Brennan LLP

(57) ABSTRACT

Apparatuses and methods for use in vacuum vapor deposition coating provide for simpler, economical and continuous operation. A system and method for continuously melting and evaporating a solid material for forming a coating vapor includes the use of a separate melting crucible and evaporating crucible. A system and method for energizing the evaporative solids to form a plasma which includes first and second electrodes and a device for selectively switching polarity between the first and second electrodes to avoid coating vapor deposition on the electrodes. Another a system and method for energizing the evaporative solids to form a plasma which includes an electric arc discharge apparatus with a cathodic and an anodic part. A continuously fed electrode is disclosed for continuous vaporization of electrode members in an electric arc discharge. An apparatus and method provides for measurement of the rate of evaporation from an evaporator and the degree of ionization in a vapor deposition coating system. Lastly, a system is disclosed for in-situ cleaning of vaporizable deposits for cleaning of the enclosure of the vacuum vapor deposition system.

7 Claims, 12 Drawing Sheets

U.S. PATENT DOCUMENTS

| | | | |
|---|---|---|---|
| 4,532,150 A | 7/1985 | Endo et al. | 427/577 |
| 4,532,196 A | 7/1985 | Yasui et al. | 430/31 |
| 4,552,791 A | 11/1985 | Hahn | 428/35.7 |
| 4,573,429 A | 3/1986 | Cobbs, Jr. et al. | 118/322 |
| 4,615,916 A | 10/1986 | Henderson | 427/255.19 |
| 4,634,605 A | 1/1987 | Wiesmann | 427/249.5 |
| 4,697,974 A | 10/1987 | Eltouky | 414/331.09 |
| 4,752,426 A | 6/1988 | Cho | 264/483 |
| 4,765,273 A | 8/1988 | Anderle | 118/729 |
| 4,824,545 A | 4/1989 | Arnold et al. | 204/298.25 |
| 4,849,088 A | 7/1989 | Veltrop et al. | 204/298.41 |
| 4,888,199 A | 12/1989 | Felts et al. | 427/10 |
| 4,902,531 A | 2/1990 | Nakayama et al. | 427/570 |
| 4,917,786 A | 4/1990 | Ehrich | 204/192.38 |
| 4,919,968 A | 4/1990 | Buhl et al. | 427/580 |
| 4,975,168 A | 12/1990 | Ohno et al. | 204/192.13 |
| 5,084,356 A | 1/1992 | Deak et al. | 428/458 |
| 5,085,904 A | 2/1992 | Deak et al. | 428/35.7 |
| 5,091,210 A | 2/1992 | Mikoshiba et al. | 427/569 |
| 5,096,558 A | 3/1992 | Ehrich | 204/192.38 |
| 5,112,644 A | 5/1992 | Seddon et al. | 427/563 |
| 5,215,640 A | 6/1993 | Buhl et al. | 204/192.38 |
| 5,250,328 A | 10/1993 | Otto | 427/535 |
| 5,308,649 A | 5/1994 | Babacz | 427/562 |
| 5,308,950 A | 5/1994 | Ramm et al. | 219/121.43 |
| 5,364,666 A | 11/1994 | Williams et al. | 427/579 |
| 5,374,314 A | 12/1994 | Babacz | 118/723 MP |
| 5,378,510 A | 1/1995 | Thomas et al. | 427/563 |
| 5,387,326 A | 2/1995 | Buhl et al. | 207/192.38 |
| 5,429,729 A | 7/1995 | Kamei et al. | 204/192.12 |
| 5,437,895 A | 8/1995 | Kodama et al. | 427/578 |
| 5,462,779 A | 10/1995 | Misiano et al. | 428/34.7 |
| 5,468,520 A | 11/1995 | Williams et al. | 427/560 |
| 5,510,155 A | 4/1996 | Williams et al. | 427/532 |
| 5,521,351 A | 5/1996 | Mahoney | 219/121.59 |
| 5,531,060 A | 7/1996 | Fayet et al. | 53/426 |
| 5,558,720 A | 9/1996 | Sarraf et al. | 118/726 |
| 5,565,248 A | 10/1996 | Plester et al. | 427/571 |
| 5,616,369 A | 4/1997 | Williams et al. | 427/536 |
| 5,651,867 A | 7/1997 | Kokaku et al. | 204/298.25 |
| 5,662,741 A | 9/1997 | Ehrich | 118/723 VE |
| 5,670,224 A | 9/1997 | Izu et al. | 428/35.8 |
| 5,677,010 A | 10/1997 | Esser et al. | 427/489 |
| 5,691,007 A | 11/1997 | Montgomery | 427/576 |
| 5,704,983 A | 1/1998 | Thomas et al. | 118/723 MP |
| 5,948,224 A | 9/1999 | Signer et al. | 204/298.08 |
| 6,132,562 A | 10/2000 | Baumecker et al. | 204/192.12 |
| 6,223,683 B1 | 5/2001 | Plester et al. | 118/723 VE |

FOREIGN PATENT DOCUMENTS

| | | | | |
|---|---|---|---|---|
| DE | 4305721 C1 | 7/1994 | | |
| DE | 4343042 C1 | 3/1995 | | |
| DE | 4412906 C1 | 7/1995 | | |
| DE | 196 00 993 A1 | 8/1996 | | |
| DE | 44 44 763 C2 | 11/1996 | | |
| DE | 195 46 827 A1 | 6/1997 | | |
| EP | 0 460 796 B1 | 4/1991 | | |
| EP | 0 460 796 A2 | 4/1991 | | |
| EP | 0 535 810 A1 | 9/1992 | | |
| EP | 0 438 627 B1 | 5/1995 | | |
| EP | 0 785291 A1 | 7/1997 | | |
| EP | 0 0550 039 B1 | 3/1998 | | |
| GB | 2 139 647 A | 11/1984 | | |
| GB | 2 263 472 A1 | 1/1992 | | |
| JP | 57169088 | 10/1982 | | |
| JP | 61104075 | 5/1986 | | |
| JP | 63243264 | 10/1988 | | |
| JP | 63312968 | 12/1988 | | |
| JP | 02118064 | 5/1990 | | |
| JP | 02-305963 | * 12/1990 | | 118/712 |
| JP | 08092764 | 4/1996 | | |
| WO | WO 92-12275 | 7/1992 | | |
| WO | WO 92/03841 | 2/1993 | | |

* cited by examiner

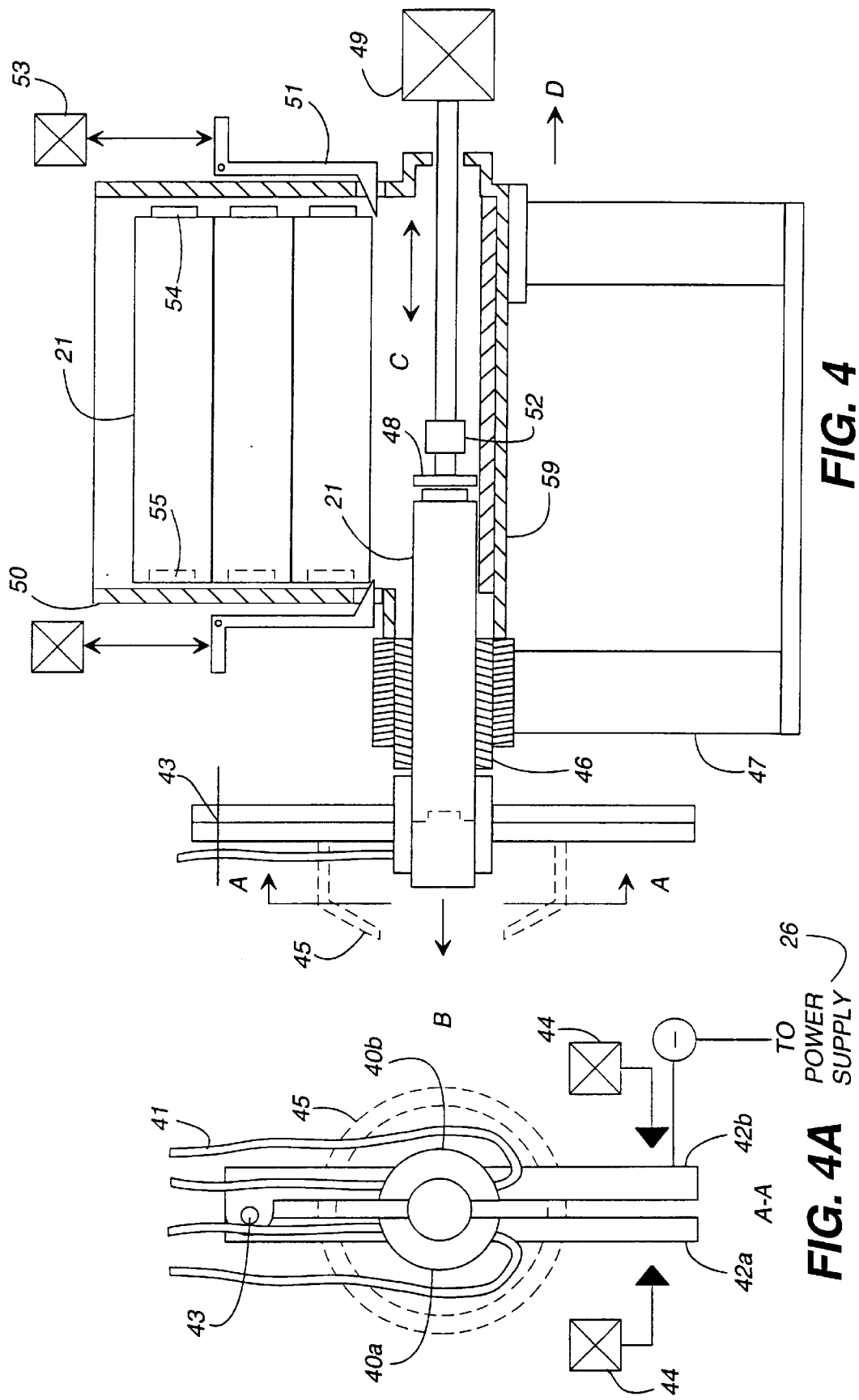

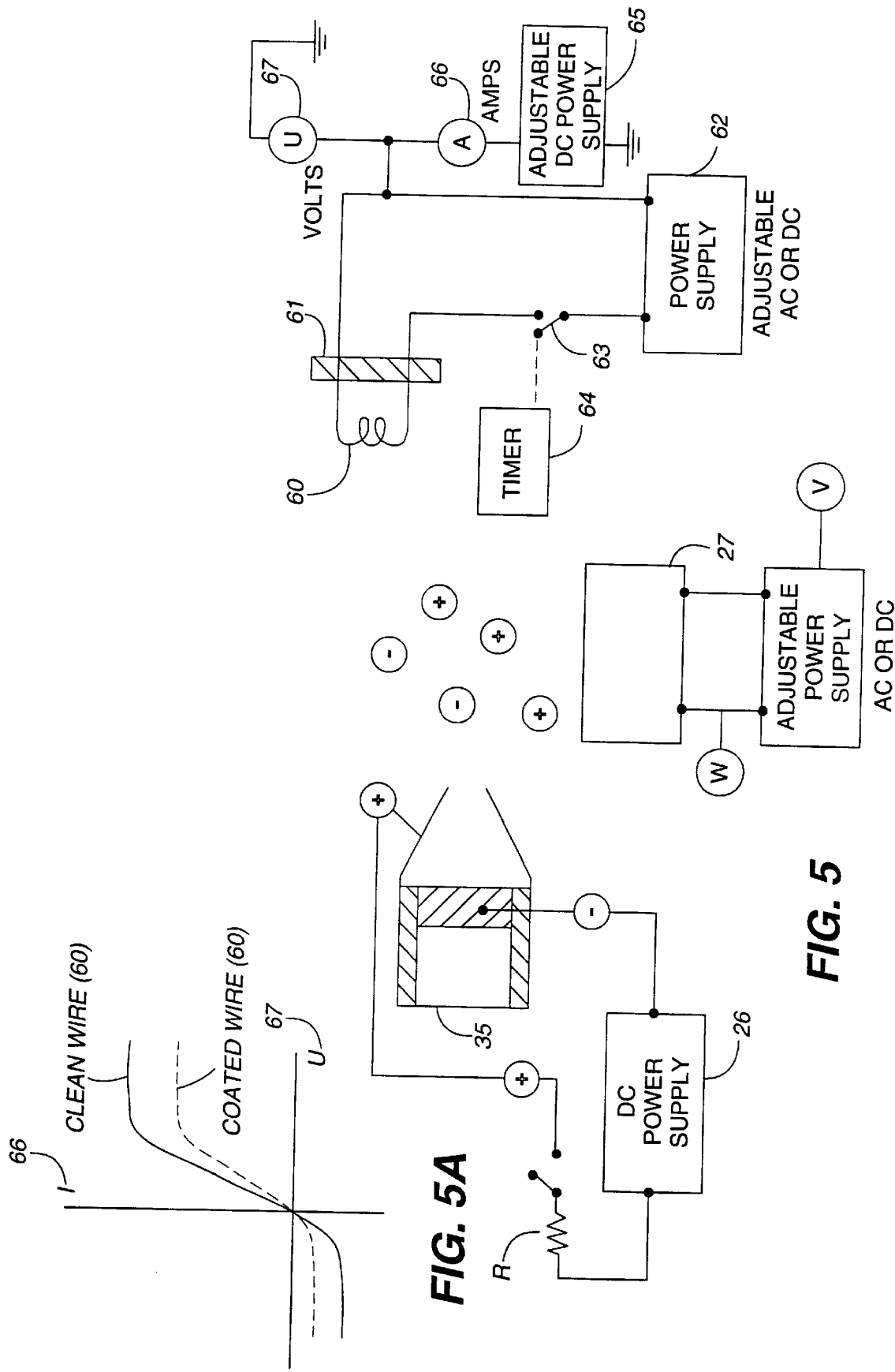

METHODS FOR MEASURING THE DEGREE OF IONIZATION AND THE RATE OF EVAPORATION IN A VAPOR DEPOSITION COATING SYSTEM

CROSS-REFERENCE TO RELATED APPLICATIONS

This application is a divisional of U.S. patent application Ser. No. 09/128,456 filed on Aug. 3, 1998, now U.S. Pat. No. 6,251,233, the subject matter of which parent application is expressly incorporated herein by reference.

TECHNICAL FIELD

This invention generally relates to vacuum vapor deposition coating of substrates and methods and systems involved in vacuum vapor deposition. More particularly, this invention relates to the production of a highly-active and energized plasma-enhanced vapor from a solid source, such as silicon, and to the application of the plasma within a continuously-operating high-speed coating system.

BACKGROUND OF THE INVENTION

The plasma-enhanced vapor may be used for deposition onto plastic articles, particularly for depositing a glass-like coating onto plastic bottles. The coating provides an enhanced gas-barrier and better adhesion compared with prior art coatings, and is suitable for pressurized containers, whose surface flexes and stretches, and whose internal pressure acts against an external coating. The primary component of the vapor is produced by evaporating, in an evaporative source, one or more solids and the deposition of the coating may be applied in conjunction with a reactive gas, or gases, to provide desired coating clarity or colorization. Further, it may be produced by using more than one evaporation source and solids of different boiling points.

Commercial applications of plastic articles have experienced a growth, because of the properties of these articles such as low-cost, light weight, flexibility, resistance to breakage, and ease of manufacture and shaping. However, plastics also have the disadvantage of relatively low abrasion-resistance and poor barrier properties against the permeation of vapors such as water, oxygen, and carbon dioxide. In food packaging applications, limitations in barrier properties have limited the use of plastics. For example, in the case of beverage bottles, inadequate barrier properties have restricted the use of smaller bottles required in some markets. Solutions to this problem, including the use of high-barrier plastics and coatings of various types, have been either uneconomical or have provided inadequate barrier-improvement or add expense to the known recycling processes.

A number of processes have been developed for the application of coatings on plastic, but these have been mainly for plastic films. Relatively few processes have been developed which allow the economic application of a glass-like coating onto preformed plastic containers such as PET bottles, where the demands on the coating's barrier performance are increased by the flexing of the walls of the bottle, the stretching of said walls under pressure, and the delaminating force due to the in-bottle pressure. Also, most processes are on the batch-production principle, and very few processes exist which can be applied to a continuously-running process.

U.S. patent application Ser. No. 08/818,342, now U.S. Pat. No. 6,223,683 filed by Plester et al on Mar. 14, 1997, and PCT International Application PCT/US98/05293 filed on Mar. 13, 1998 describe the use of an anodic arc for externally-coating beverage bottles and their disclosures are incorporated by reference herein in their entirety. Anodic arc systems are also described by Ehrich et al in U.S. Pat. Nos. 4,917,786; 5,096,558; and 5,662,741, the disclosures of which are also incorporated herein by reference.

The basic anodic system, as described by the prior art, has the following disadvantages:

a) The crucibles evaporative material content, such as silicon, cannot be replenished continuously when this evaporative material is in powder or pellet/chip form.

b) The quantity of vapor evolved from the crucible depends partly on the degree of filling of the crucible with evaporative material. Since the degree of crucible-filling is a variable which constantly changes, this could present a control problem.

c) The distribution, at various angular displacements, of the quantity of vapor evolved from the crucible, also depends partly on the degree of filling of the crucible with evaporative material. This makes it difficult to use the vapor from the crucible for the purpose of coating several articles simultaneously, without the risk that these will all receive different amounts of coating.

d) The lips of the crucible are eroded by the anodic arc. This not only presents a maintenance problem, but it also means that the material of the crucible may thus be included in the coating composition and thereby reduce the performance of the coating. For example, crucibles for holding silicon are normally constructed of carbon, which is eroded and vaporized by the anodic arc and the carbon vapor is free to form a contaminant in the desired silicon or silicon dioxide coating.

e) The said crucible lip erosion further affects the quantity of vapor evolved and the distribution of this vapor at various angular displacements around the crucible.

f) Even where the crucible is independently heated (rather than intentionally heated by the anodic arc), the anodic arc represents a second and uncontrolled source of heating. This second source of heating partly affects the quantity of vapor evolved, irrespective of any control device for the crucible's independent heating system. This makes process control of evaporation rate difficult, whilst evaporation rate is an important parameter.

g) The anodic arc energizes the plasma, but since an uncontrolled and unknown portion of this arc's energy is dissipated by evaporation of the material in the crucible, this makes the process control of the critical parameter of plasma-enhancement difficult.

h) Since part of the energy of the anodic arc inadvertently causes evaporation, even in anodic arc systems with independent crucible heating, this limits the amount of energy available for plasma enhancement.

i) Anodic arc systems employing independent crucible heating have complicated designs around the crucible in view of the conflicting needs, on the one hand to heat the crucible and on the other hand to provide a cooled anodic connection. This can result in additional cost and complication, oversized heating systems, and energy waste, as well as lead to crucible-damage on shut-down due to the cooling-effect of the anodic connection.

j) Many applications, particularly those involving colored coatings, require the simultaneous evaporation of more than one solid substance. For barrier enhancement, it can also be desirable to add other substances to the base coating. Since such substances differ in boiling point, they cannot be combined in a single evaporating crucible, because evaporative fractionation within the crucible would lead to poor coating composition control. Therefore, multi-component coatings using the anodic arc system must be produced by a multi-series of anode-cathode couples, since one separate anodic arc source for each crucible is needed for process-control purposes. This not only makes a multi-component coating systems complicated and expensive, but also risks interference between the closely positioned array of anodic arcs.

k) The cathode's evaporative material cannot be replenished continuously and it is therefore desirable in practice to use materials which erode slowly. This acts contrary to the desire to use the cathode for optimum plasma enhancement and ionization, since materials which achieve this often have a high erosion rate. The use of Zn, Cu, Al, noble metals, alkaline earths, and particularly Mg, has been found to be highly desirable, and in most cases continuous cathode replenishment is needed for economic operation.

Prior art exists (German Patent DE 4440521C1, Hinz et al) where the crucible is independently heated by electrical resistance or by thermal radiation, and where the anodic arc plasma-enhancement is provided separately by means of a cathode and a separate anode. However, the anode of such systems quickly becomes coated with the evaporated material from the crucible, or with plasma particles, or with the reaction product when a reactive gas is used. Such systems are therefore only usable where the coating is electrically conducting, since the anode would otherwise quickly become inoperative and the system would shut down. Since the barrier coating of plastic articles often requires the use of coatings with materials such as silicon, which are electrically non-conducting, such prior art cannot be used for many barrier coating systems.

It is important to control accurately the coating thickness on a plastic article and therefore highly desirable to be able to measure continuously, and in situ, the rate of deposition from an evaporative source, so that adjustments to the controls of the said evaporator source can be made as needed throughout the coating operation. Prior art provides means for measuring the rate of deposition by measuring the change of the oscillation frequency of a crystalline substance as the evaporated solids deposit on said crystalline substance. However, the crystalline substance quickly becomes coated and can no longer function, so the system is not usable for normal process control in continuous operating coating systems. A self-regenerating system for rate-of-deposition measurement is needed to enhance process control.

The quality of a coating on plastic articles, particularly the quality of the barrier property of coatings on plastic bottles, is dependent on the control of the degree of ionization and thus on the energy-level of the plasma. A suitably high-energy plasma enables the substrate surface to be cleared of dirt and inert molecules, promoting coating adhesion and coating purity, and further enables coating particles to become embedded in the substrate or to react with the substrate, additionally promoting adhesion. High-energy plasma also promotes the chemical reaction of coating particles with each other, thus forming a dense matrix on the substrate surface, which further enhances adhesion and barrier properties. Finally, high-energy plasma induces coating particles to be deposited in a flat, dense physical structure due to the impingement of high-energy collisions, enhancing coating continuity and denseness. On the other hand, over-energized plasma may overheat the substrate, or cause excessive decomposition or degassing from the substrate, or damage the coating. The evolution of gases from the substrate surface during its degassing mixes with the coating particles and reduces coating quality. It is thus important to measure and control plasma energy and degree of ionization. Prior art does not teach how this can be achieved.

An example of the need for controlled use of high-energy plasma is presented by barrier coating of plastic bottles for carbonated beverages. A barrier coating on a plastic bottle for carbonated beverages must desirably be able to flex, stretch, have adhesion capable of withstanding the pressure migration of the carbon dioxide from the inside of the bottle, and be robust and abrasion resistant in use. It is also desirably dense, preferably amorphous and continuous over the bottle surface. These properties rely on applying controlled. high-energy plasma.

All evaporator systems deposit particles within their enclosure, the latter being normally a high vacuum enclosure. Operation under vacuum is necessary so as to avoid heat damage of heat sensitive substrates such as plastic, and also to avoid gas phase reactions, which in turn would reduce the barrier and other qualities of the coating, since many of these desired properties rely on the on-surface interaction of the coating particles. Particles deposited within the vacuum enclosure tend to disturb the mechanical operation of the coating system and in particular tend to absorb volatiles and make vacuum pump-down more difficult. As a result, the walls of such vacuum enclosures must be cleaned regularly, and this involves production loss and shut-down. An in-situ cleaning system which enables regular and rapid cleaning of the enclosure internals without releasing vacuum and opening the enclosure is desirable for continuous operation and would improve economic operation by reducing downtime.

SUMMARY OF THE INVENTION

Accordingly, it is an object of this invention to provide a system for plasma-enhanced evaporation of one or more solid materials, normally inorganic solid material(s), and for use of such an evaporation system in vapor deposition coating of a plastic substrate such as a plastic beverage container, with or without reactive gases, in a manner which enables continuous operation and the provision of a well controlled, high energy plasma. The following are further objects of this invention:

a) To enable replenishment, within the evaporator-crucible system, of the solid material to be evaporated and used for coating without interrupting the evaporator operation;

b) To enable the said evaporator crucible to remain at substantially the same degree of filling during its operation;

c) To provide a vapor particle distribution around the said crucible, which continuously remains constant and well directed;

d) To provide an evaporation system where both the evaporator-energy supply to the crucible and the control of this energy are substantially independent of the energy supplied for plasma-enhancement;

e) To provide an evaporation system with electric arc discharge plasma enhancement which has improved control of each system function, substantially avoids erosion or damage of the evaporator crucible, whose crucible can have a simpler design, which can operate with vapors whose deposited solids are non-conducting electrically, which enables several materials to be evaporated separately but enhanced by the same single arc;

f) To enable continuous replenishment of the cathode's evaporative material;

g) To enable high energy plasma through use of rapidly eroding materials at the cathode, particularly Mg, other alkali metals, and metals of relatively low boiling point;

h) To enable materials produced by the erosion of the cathode (e.g. Mg, alkaline metals, low boiling point metals. etc.) to be incorporated as dopants in the coating;

i) To enable substantially uninterrupted measurement and control in a continuously running coating process, of evaporation rate and degree of ionization; and j) To enable in-situ cleaning of vacuum enclosures without need to release vacuum, thereby enhancing the operation of continuously running coating processes.

The foregoing and other objects of this invention are fulfilled by providing a system and method for continuously melting and evaporating a solid material for use in a vapor deposition coating system, a vapor deposition coating system including said continuous melting and evaporating system, a vapor deposition coating system including an electric arc discharge system which switches polarity between electrodes during operation, a vapor deposition coating system comprising an electric arc discharge system including an electrode with combined anodic and cathodic parts for ionization, a continuously fed electrode for producing an electric arc discharge and a coating vapor, a system for measuring the rate of evaporation from an evaporator and the degree of ionization in a vapor deposition coating system, and a self-cleaning vapor deposition coating system. Each of these aspects of the present invention are summarized below.

The system of this invention for continuously melting and evaporating a solid material comprises a melting crucible for receiving and melting a solid material to form molten material and an evaporating crucible for evaporating the molten material. The evaporating crucible is connected to the melting crucible in flow communication with the melting crucible for receiving the molten material from the melting crucible and releasing vapor through an opening in the evaporating crucible as the molten material evaporates. This arrangement allows for additional evaporative solid material to be continuously added to the melting crucible without interfering with evaporation of the molten solid in the evaporating crucible. Accordingly, solid evaporative material can be continuously added to the evaporator during operation of the evaporator so that a coating system incorporating this melting and evaporating system can continue uninterrupted for an extended period. Furthermore, because the evaporating crucible is separate from the melting crucible, the melting crucible and the evaporating crucible can be heated separately and maintained at different temperatures and the evaporating crucible can be made much smaller than the melting crucible. In addition, the evaporating crucible and the melting crucible can be arranged so that the level of molten evaporative material in the evaporating crucible remains substantially constant to provide constant and well directed coating vapor.

The corresponding method of this invention for continuously melting and evaporating a solid material therefore comprises the steps of melting the solid material in a melting crucible to form molten material, flowing the molten material from the melting crucible into an evaporating crucible connected to the melting crucible, evaporating the molten material in the evaporating crucible to form a vapor, and releasing the vapor from the evaporating crucible. This system and method of the present invention desirably includes continuously and automatically feeding the solid evaporative material into the melting crucible as the molten material evaporates so as to maintain the molten material in the evaporating crucible at a substantially constant level during evaporation of the molten material. Various embodiments of this continuous melting and evaporating system include an arrangement wherein the melting crucible and evaporating crucible are arranged so that the melting crucible and the evaporating crucible hold molten material at the same hydraulic level, an arrangement wherein the evaporating crucible draws the molten evaporative solid from the melting crucible via capillary action, and an arrangement wherein the evaporating crucible draws the molten evaporative material from the melting crucible via thermal syphonic force. Other embodiments include an arrangement wherein a pivoting melting crucible melts solid evaporative material and periodically pours molten evaporative material into an evaporation chamber and an arrangement wherein an electrically heated element melts and evaporates solid evaporative material in a melting crucible. Such embodiments do not require energy from an electric arc discharge for evaporation of the solid material and are simple, relatively inexpensive, and resistant to heat damage.

The foregoing system for continuously melting and evaporating a solid evaporative material is particularly useful in a vacuum vapor deposition coating system wherein the continuous melting and evaporating system is disposed within a vacuum cell capable of maintaining a vacuum within the vacuum cell.

The vapor deposition coating system and method of the present invention involving switching polarity between electrodes includes forming a vacuum within a vacuum cell, supplying a coating vapor in the vacuum cell, passing the coating vapor through a gap between a first electrode disposed in the vacuum cell and a second electrode disposed in the vacuum cell, supplying electric power to the first and second electrodes so that the first and second electrodes become oppositely charged and create an electric arc discharge between the first and second electrodes, and switching polarity between the first and second electrodes while the electric power is supplied to the first and second electrodes. The switch is desirably operated automatically and repeatedly switches the polarity between the first and second electrodes and the electric power supply is a DC power supply. By switching the polarity between the first and second electrodes, each electrode alternates between anodic and cathodic function, so that coating vapor, which deposits on the first and second electrodes when the electrodes are in the anodic function, is evaporated when the electrodes are in the cathodic function. Eventually, the coating vapor, when non-electrically conductive, can disrupt the operation of an electrode in a vapor deposition coating system. By switching the polarity between first and second electrodes, the first and second electrodes remain substantially free of deposited coating.

According to another vapor deposition coating system and method of the present invention, a vacuum is formed within a vacuum cell, coating vapor is supplied in the vacuum cell, the coating vapor is passed adjacent an electric arc discharge apparatus, and electric power is supplied to the electric arc discharge apparatus so that a cathode portion of the electric arc discharge apparatus becomes negatively charged and an anodic hood, at least partially covering the cathode becomes positively charged, so that an electric arc discharge is created between the cathode and the anodic hood. The electric arc discharge apparatus includes an electrically insulating material connecting the cathode to the anodic hood, and the cathode and the anodic hood are arranged to form an ionization chamber with the anodic hood having a plasma discharge opening. When electric power is supplied to the electric arc discharge apparatus, an electric arc discharge is created between the cathode and the anodic hood in the ionization chamber, the cathode emits electrons and ionizes the coating vapor disposed in the vacuum cell by the source of coating vapor, the cathode vaporizes and forms an ionized cathode vapor within the ionization chamber and the ionized cathode vapor is emitted from the discharge opening of the anodic hood and mixes with the coating vapor from the evaporation source and the reactive gas, if any, in the vacuum cell to form a coating plasma. The foregoing method and system are relatively simple and economical for producing a plasma enhanced coating vapor in a vapor deposition coating system.

The continuously fed electrode of this invention comprises a plurality of electrode members which vaporize when connected electrically to provide an electric arc discharge, a housing defining a loading chamber for receiving the electrode members in series and including an electrically insulating sleeve, and an electrode member feeder for continuously feeding the plurality of electrode members, in series, through the insulating sleeve in the housing to an electric arc discharge position so that one of the plurality of electrode members is being fed to the electric arc discharge position at a time. This system enables continuous replenishment of the electrodes evaporative material and enables the use of rapidly eroding materials at the cathode of a high energy plasma coating system, enables materials produced by the vaporization of the electrode members to be incorporated as dopants in a vapor deposition coating system, and enables substantially uninterrupted production of ionized vapor in an electric arc discharge vapor deposition coating system.

Desirably, the continuously fed electrode functions as a cathode in an electric arc discharge apparatus. The electrode members are desirably elongate rods or cylinders and are automatically fed from a magazine into the loading housing so that the electrode member feeder can continuously feed the plurality of electrode members, in series, to the electric arc discharge position. In addition, the continuously fed electrode includes a cooling system for cooling the one electrode member, which is in the electric arc discharge position.

The present invention also encompasses an electric arc discharge apparatus comprising the continuously fed electrode described above, an anode, and an electric power supply for supplying electric power to the one electrode member and the anode. The electric power is supplied so that the one electrode member and the anode become oppositely charged with the one electrode having a cathodic charge and the anode having an anodic charge. This creates an electric arc discharge between the one electrode member and the anode so that the plurality of electrode members are vaporized, in series, as each of the plurality of electrode members are fed into the electric arc discharge position within the electrode housing.

Alternatively, the present invention encompasses electric arc discharge apparatus comprising the continuously fed electrode described above and an electric power supply. The continuously fed electrode includes a hood for at least partially covering the one electrode member in the electric arc discharge position. An electrically insulating material insulates the one electrode member in the electric arc discharge position from the hood and the hood is arranged to form an ionization chamber into which the electrode members are fed from the housing. When the electric power supply supplies electric power to the electric arc discharge apparatus, the one electrode member being fed to the electric arc discharge position and into the ionization chamber becomes negatively charged and the hood becomes positively charged so that an electric arc discharge is created between the one electrode member and the hood in the ionization chamber, the one electrode member vaporizes and forms an ionized vapor within the plasma chamber, and the ionized vapor is emitted from the discharge opening of the hood to mix with the vapor from the evaporation source and form a plasma.

The present invention also encompasses a vapor deposition coating system comprising the continuously fed electrode described above and a vacuum cell in which the continuously fed electrode is disposed. This vapor deposition coating system also includes a source of coating vapor disposed in the vacuum cell, a second electrode disposed in the vacuum cell, and an electric power supply for supplying electric power to the one electrode member and the second electrode so that the one electrode member and the second electrode become oppositely charged, create an electric arc discharge and ionize the coating vapor. Desirably, this vapor deposition coating system further includes an evacuation cell for feeding electrode members into the vacuum cell while the vacuum cell maintains a vacuum. The evacuation cell is capable of receiving electrode members from outside the vacuum cell, evacuating air from the evacuation cell, and feeding the electrode members into the vacuum cell under vacuum without disrupting the vacuum within the vacuum cell.

The present invention further encompasses an apparatus for measuring the rate of evaporation from evaporator and the degree of ionization in a vapor deposition coating system comprising two electrical circuits connected to a wire. The first electrical circuit includes a wire, an ammeter connected to the wire for measuring electric current through the wire and a variable DC-power source. When the wire is exposed to an ionized gas, a current flows from the said DC-power source, through the ammeter and through the ionized gas to the walls of the ionized gas enclosure or vacuum cell and to ground. The current flow, measured by the ammeter, bears a relationship to the degree of ionization in the ionized gas and increases as the degree of ionization increases.

The second electrical circuit includes the said wire, a DC or AC supply and a switch. The apparatus desirably includes a timer for controlling the opening and closing of the switch. Particles from the ionized gas deposit on the said wire when the wire is cold and the electrical resistance of theses particles reduces the current flow in the first electrical circuit. When the switch is closed, a current flows within the second electrical circuit and heats up the said wire, thus causing the deposited particles to re-evaporate, which prevents these particles from insulating the wire and affecting the electrical current flow. The electrical current flow measured in the first electrical circuit therefore retains a constant relationship to the degree of ionization, so long as the wire is heated. The measurement of degree of ionization which this relationship provides, can be used to control the degree of ionization, by means of adjusting the current flow from the power supply to the electric arc by conventional means.

When the switch is opened, the wire cools and particles from the ionized gas begin to deposit on the wire. The electrical resistance of these particles reduces the current flow in the first electrical circuit and the rate of reduction bears a relationship to the rate of deposition of particles, which in turn bears a relationship to the rate of production of coating particles by the evaporator and electric arc means. The rate of evaporation can thus be controlled by adjusting the current flow from the power supply to the evaporator by conventional means.

The vapor deposition system itself is as described above and includes an enclosure or cell, which must normally be maintained under vacuum, and a source of ionized coating vapor which is disposed within the said cell. The self-cleaning means includes one electrode, or a plurality of electrodes, disposed within the cell. The electrodes are connected to a power supply and are arranged so that the entire gas space within the cell can be subjected to an ionizing discharge. Suitable forms of power supply include HF, RF and DC. As the coating of substrate proceeds within the cell, it is inevitable that the coating particles deposit also on the interior of the cell and on its internal parts. Such deposits include volatile components which can re-evaporate and impair the function of the coating system. The volatile components of the deposits within the interior of the cell and its internal parts are removed by supplying sufficient ionizing power to the electrode or electrodes disposed in the vacuum cell to ionize gas in the vacuum cell so that the ionized gas removes the deposited coating vapor. This could be done during the operation of the coating system or while the coating system is inoperative.

Other objects, features, and advantages of this invention will become apparent from the follow detailed description, drawings, and claims.

BRIEF DESCRIPTION OF THE DRAWINGS

FIG. 4 is a side elevation view of a continuously fed electrode made according to an embodiment of this invention.

FIG. 4A is a sectional end view of the electrode illustrated in FIG. 4.

FIG. 5 is a schematic diagram of a system for measuring the rate of evaporation and degree of ionization within a vacuum vapor deposition coating system, in accordance with an embodiment of this invention.

FIG. 5A is an example graph of current versus voltage when measuring degree of ionization with the electric circuit illustrated in FIG. 5.

DETAILED DESCRIPTION OF EMBODIMENTS

Overview

Figure 1:
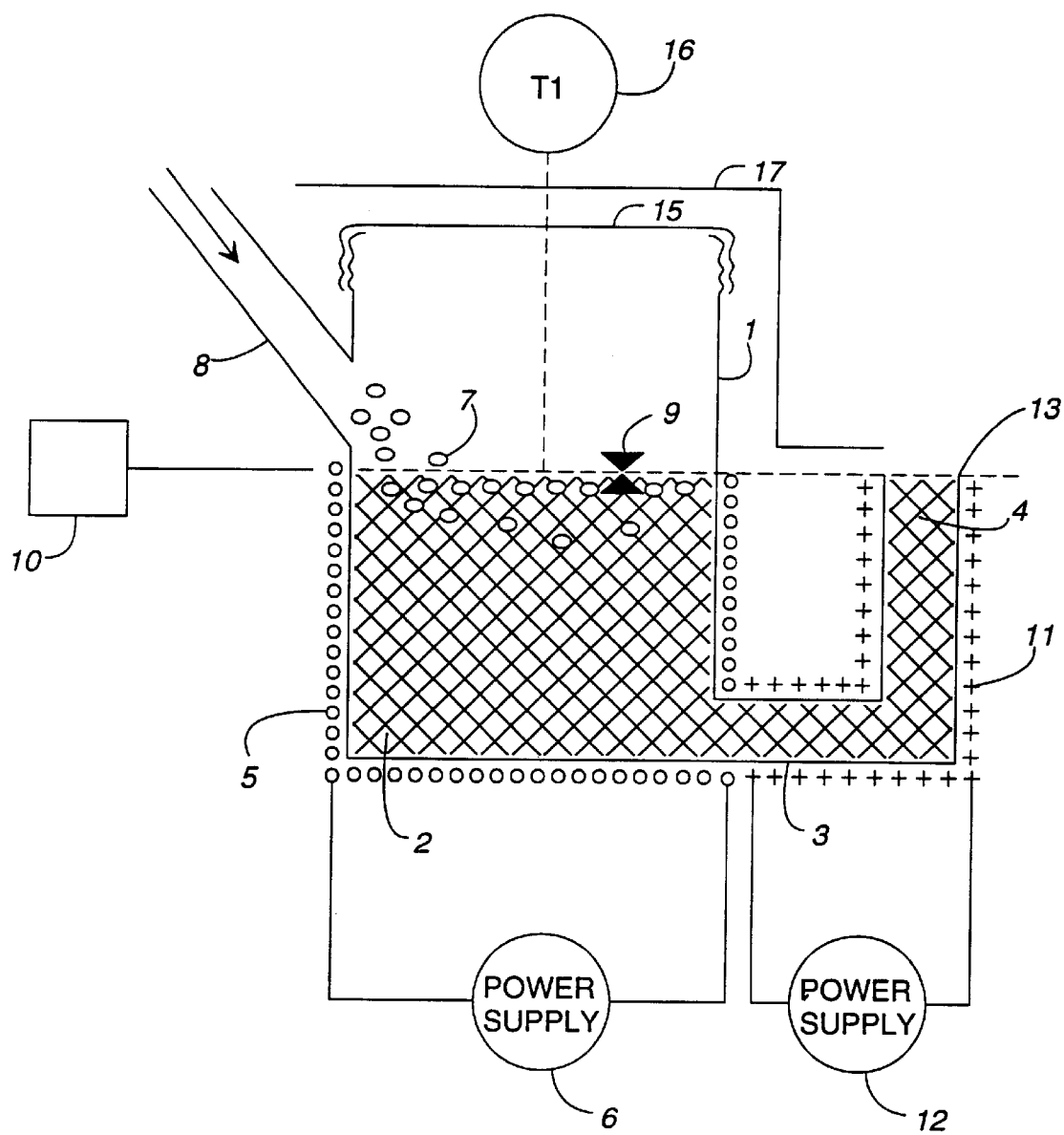
FIG. 1 is a schematic diagram of an evaporator system, made according to an embodiment of this invention, including a continuously-fed melting crucible connected to an evaporating crucible.

As summarized above, this invention encompasses vacuum vapor deposition systems and methods, and systems and methods for use in vacuum vapor deposition onto substrates. The following includes a detailed description of embodiments of this invention including evaporator systems and methods, electric arc discharge systems and methods with polarity switching electrodes, electric arc discharge systems and methods with a combination cathodic/anodic electrode, electric arc discharge systems and methods with a continuously fed electrode, a system and method for measuring rate of evaporation and degree of ionization in a vapor deposition coating system, and a self-cleaning vacuum vapor deposition coating system. In the detailed description, like reference numerals are used to refer to like parts throughout the Figures.

Evaporator Systems and Methods

FIG. 1 shows an evaporator system suitable for a solid, such as silicon, and principally comprising a melting crucible 1, a molten evaporative material 2, a short conduit 3, and an evaporating crucible 4 connected in fluid flow communication to the melting crucible by the short conduit, the evaporating crucible being in the form of a straight-through, relatively narrow bore pipe. In this arrangement, the melting crucible 1 and the evaporating crucible are side-by-side. The melting crucible 1 is heated by a melting crucible heater 5, which is a suitable, conventional device, and normally consists either of a radiant heater, or a contact heater, or a resistance heater. For example, for melting silicon, a radiant heater complete with an external heat insulating mantle is an effective solution. The melting crucible heater 5 is provided with an adjustable AC or DC power-supply 6 and this power supply incorporates the necessary conventional means for controlling the energy output of the melting crucible heater 5 so as to provide temperature control.

The solid evaporative material 7 to be melted is fed through an opening in the melting crucible 1 in the form of powder or chips or pellets or the like by means of a feeder such as a chute 8. Suitable solid evaporative materials for vacuum vapor deposition coating include silicon and are listed in PCT International Application PCT/US98/05923, already incorporated herein by reference. The design of the feed-system, connected to chute 8 is not shown, and will depend on the material and its form, and employ conventional material feed means. For example, in the case when silicon is used as the solid evaporative material, the material would preferably be in form of pellets, and the feed system would include a silo or bin to hold the said pellets, and a valving system at base of the silo/bin to enable a controlled amount of pellets to flow down chute 8 whenever the melting crucible 1 requires material make-up. Said material make-up is necessary whenever the level 9 of molten evaporative material in the melting crucible 1 drops by a predetermined amount. The level 9 of molten evaporative material can be monitored by a level-monitor 10, using conventional non-contact methods such as X-rays, ultrasound, or by weighing the melting crucible 1, together with any components rigidly attached to it.

The molten evaporative material 2 flows from the melting crucible 1 through the conduit 3 to the evaporating crucible 4. The evaporating crucible 4 is heated by the evaporating crucible heater 11 and a separate, adjustable, evaporating crucible power supply 12, employing similar conventional means as already described for the heating of melting crucible 1. The evaporating crucible 4 is heated to a temperature suitable for evaporating the molten evaporative material 2 in the evaporating crucible and the coating vapor produced is released from the evaporating crucible through an opening 13 in the top of the evaporating crucible. The power supply 12 for the evaporating crucible 4 is independently controlled from the power supply 5 for the melting crucible 1 so that the temperature of the melting crucible, which is desirable larger than the evaporating crucible, can be maintained at a lower level than the temperature of the evaporating crucible.

The hydraulic level 9 of material 2 in the melting crucible 1 equates to the hydraulic level in the evaporating crucible 4 due to natural hydraulic forces. As the evaporative material 2 is automatically fed into the melting crucible 1 to maintain level 9, this automatically maintains a substantially constant and correct level in the evaporating crucible 4 as the molten evaporative material evaporates, and thus the conditions for constant vapor evolution rate and constant particle distribution from the evaporating crucible are achieved.

The rate of evaporation from the evaporating crucible 4 is controlled by regulating the energy input to the evaporating crucible power supply 12, using conventional heater power regulation means. The rate of evaporation from the evaporating crucible 4 is adjusted to give the desired rate for the coating process by means described hereinafter.

The melting crucible 1 is provided with a lid 15 to reduce migration of vapor. Excessive vapor in this melting crucible 1 can adversely affect the material feed system to chute 8 and the heaters 5 and 11. Ideally, the melting crucible 1 should be maintained at a temperature which is sufficient to melt the evaporative material 2 while producing minimal vapor. Control of the temperature of the evaporative material 2 in the melting crucible 1 is through the energy input from power supply 6 and this energy input is regulated by conventional means. The energy regulator can be controlled according to the rate of in-flow of pellets 7, which in-flow will normally be constant, or, optionally, according to the temperature measurement 16 of the evaporative material 2 by conventional non-contact means such as IR-measurement. Optionally, temperature measurement 16 can be by an electric resistance thermometer or a bimetallic thermocouple embedded in the walls of the melting crucible 1.

For coating heat-sensitive articles, such as PET beverage bottles, it is important to reduce the heat radiated from the evaporator system. A heat shield 17 constructed of reflective material of suitable heat and corrosion resistance, such as stainless steel, covers the melting crucible 1 and the connecting conduit 3. The system illustrated in FIG. 1 is particularly advantageous with respect to avoiding heat damage of coated articles, since the only part able to radiate heat directly onto the coated articles is the evaporating crucible 4, whose dimensions are small because the evaporating crucible has little capacity due to its continuous feed.

Although not illustrated in FIG. 1, the melting crucible 1 can be linked to more than one evaporating crucible 4 by means of multiple conduits 3 where this is needed by a specific system. Such an arrangement reduces the cost and/or complication of multiple solid feed systems to the chute 8.

Construction materials for the evaporator system described will depend on the material 2 to be evaporated. Generally, suitable construction materials for the evaporator system can withstand the high temperature necessary to melt and evaporate the solid evaporative material 2 without deteriorating or melting and must be inert to the evaporative material 2. For the evaporation of silicon, system components 1, 3 and 4 are preferably constructed of a heat conductive grade of carbon.

Figure 1B:
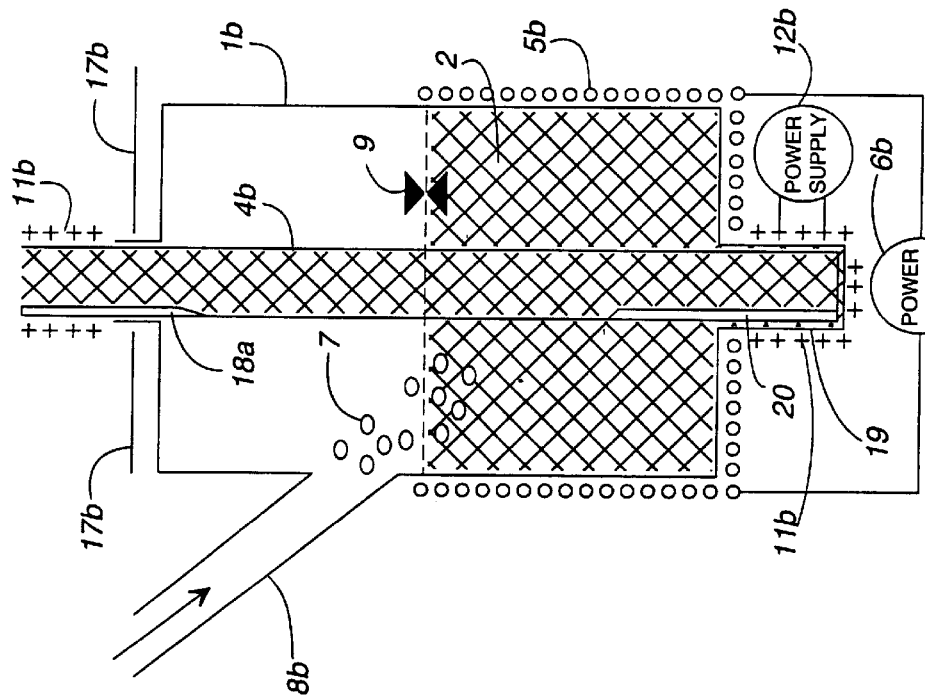
FIGS. 1A, 1B, 1C, 1D and 1E are schematic diagrams of optional arrangements of a continuously-fed dual crucible system, according particular embodiments of the present invention.
Figure 1A:
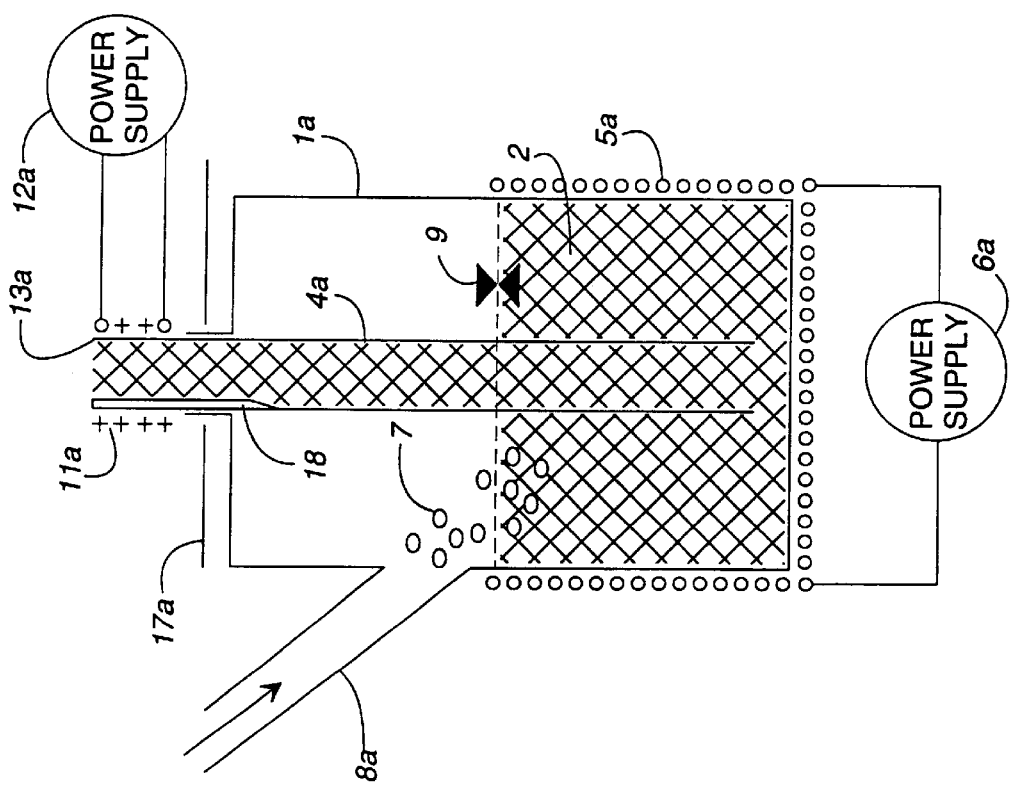
Figure 1C:
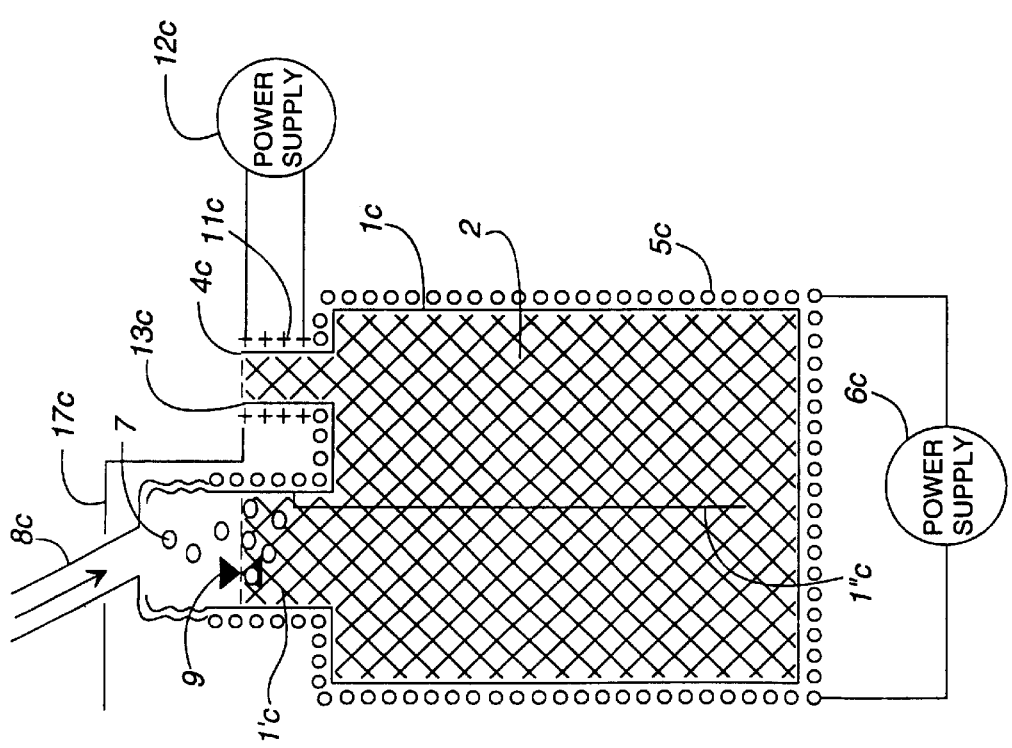

FIGS. 1A, 1B and 1C show versions of the system illustrated in FIG. 1 not requiring the short connecting conduit 3, since this feature can lead to leaks with molten evaporative materials 2 of certain substances. In FIG. 1A, a melting crucible 1a is heated by a melting crucible heater 5a and an adjustable power-supply 6a. A tubular evaporating crucible 4a is mounted within the melting crucible 1a so that the melting crucible holds the molten material 2 at a first level and the evaporating crucible holds the molten material at a second level which is above the first level and the evaporating crucible, at least partially submerged in the molten material, draws the molten material from the melting crucible, through the evaporating crucible, to a vapor releasing opening 13a via capillary action. The top of the tubular evaporating crucible 4a extends through an opening in the melting crucible lid 15a and is heated by the evaporating crucible heater 11a and the associated adjustable power-supply 12a, and thus the temperature of the molten evaporative material is brought from melting temperature level to evaporation temperature level.

An overflow cavity 18 is positioned to allow excess molten material 2 to drip back into the melting crucible 1a. This overflow cavity 18 enables the outside of the top of the tubular evaporating crucible 4a to remain essentially free of molten evaporative material 2 and thus the top of tubular evaporating crucible 4a may be heated by conventional radiant or resistance heating. A heat shield 17a is positioned above the melting crucible 1a for the same purpose, and with same basic construction, as already described with regard to FIG. 1. Vapor is emitted from the release opening 13a at the top of the tubular evaporating crucible 4a in same manner as described under FIG. 1. Control of the temperature of the evaporative material 2 and of the evaporative material level 9 are also as described under FIG. 1.

In FIG. 1B, a melting crucible 1b has a well 19 extending below the bottom of the melting crucible and an adjustable power supply 6b. The foot of the tubular evaporating crucible 4b fits tightly into the well 19 and can be fed with molten evaporative material 2 from the melting crucible 1b by a small channel 20 and the upper portion of the evaporating crucible extends out of the melting crucible through an opening in the lid 15b of the melting crucible. The tubular evaporating crucible 4b is mounted within the melting crucible 1b so that the melting crucible 1b holds the molten material 2 at a first level and the evaporating crucible holds the molten material at a second level which is above the first level and the evaporating crucible, at least partially submerged in the molten material, draws the molten material from the melting crucible, through the evaporating crucible, to a vapor releasing opening 13a via thermal syphonic forces. The well 19 is externally heated by the evaporating crucible heater 11b and associated adjustable power supply 12b to evaporating temperature, as is the upper portion of the evaporating crucible 4b proximate a vapor releasing opening 13b. By the action of the thermal-syphon forces, molten evaporative material 2 rises up the tubular evaporating crucible 4b and excess molten evaporative material 2 continuously overflows back down to the melting crucible 1b via a series of cavities 18a. A heat shield 17b is provided for the same purpose and with same basic construction as already described above. Vapor is emitted from the vapor release opening 13b in the top of the tubular evaporating crucible 4b in the same manner as already described under FIG. 1. Control of the temperature of the evaporative material 2 and of the evaporative material level 9 are also as described under FIG. 1.

In FIG. 1C, a tubular evaporating crucible 4c is an integral part of a melting crucible 1c and its spout-like extension 1'c. This arrangement can be beneficial where it is difficult to seal vapor evolution from molten evaporative material 2 through component joints, since such joints are completely avoided in FIG. 1C. The flow of pellets 7 now flows into the spout-like extension 1'c so as to the maintain the level 9 of the evaporative material substantially constant. The melting crucible 1c incorporates a loose-baffle 1"c which is introduced through the opening of spout-like extension 1'c and this loose-baffle 1"c prevents unmolten pellets 7 from flowing to the tubular evaporating crucible 4c. The evaporator system in FIG. 1C functions similarly to the systems already described with regard to FIGS. 1, 1A, and 1B, and incorporates a melting crucible heater 5c, an evaporating crucible heater 11c, associated adjustable power supplies 6c and 12c, and a heat shield 17c.

Figure 1D:
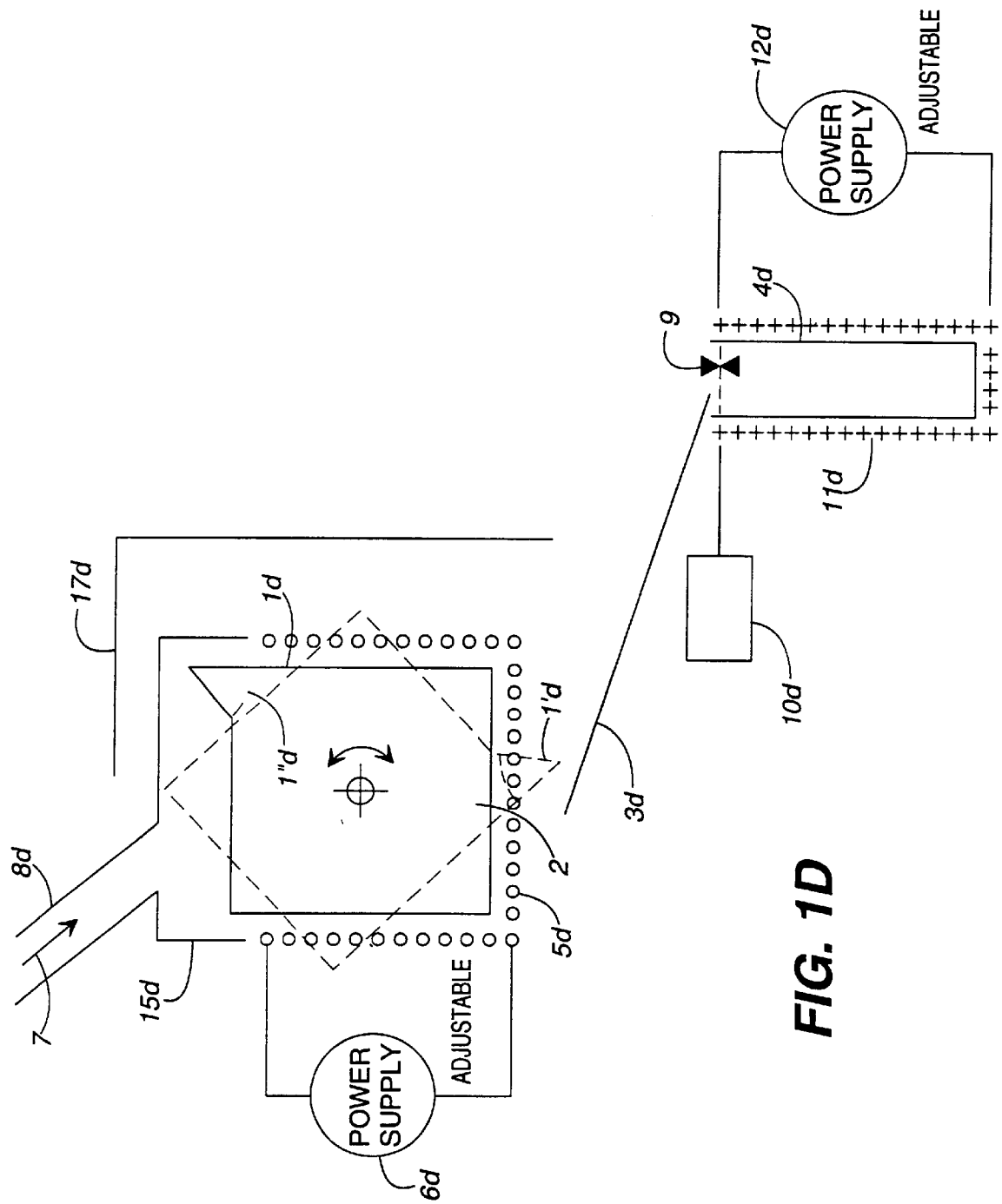

FIG. 1D shows a method of melting the evaporative material 2 in a batchwise-operating melting crucible 1d which is heated, in the manner already described, by crucible heater 5d and power supply 6d. The melting crucible 1d receives a fixed batch of solid pellets 7 via chute 8d when in its upright position (shown in solid line). When the batch of solid pellets 7 has melted, the melting crucible 1d can be tilted to a pouring position (shown in chain-clothed line) and in this position releases a required amount of molten material 2, which flows down conduit 3 to evaporating crucible 4d. The released amount of material 2 is controlled by a level-monitor 10a such as to maintain an hydraulic level 9. As material 2 is evaporated in evaporating crucible 4d, level 9d falls and the filling operation, by means of tilting melting crucible 1d, is repeated. Melting crucible 1d can be fitted with a pouring spout 1'd and a pouring sieve 1"d to avoid drips and to avoid passage of relatively large solid pieces of material 2 to the evaporating crucible 4d. The evaporating crucible 4d is heated by the evaporating crucible power supply 12d, using conventional heater power regulation means. The tilting of melting crucible 1d is by conventional means (not shown).

Figure 1E:
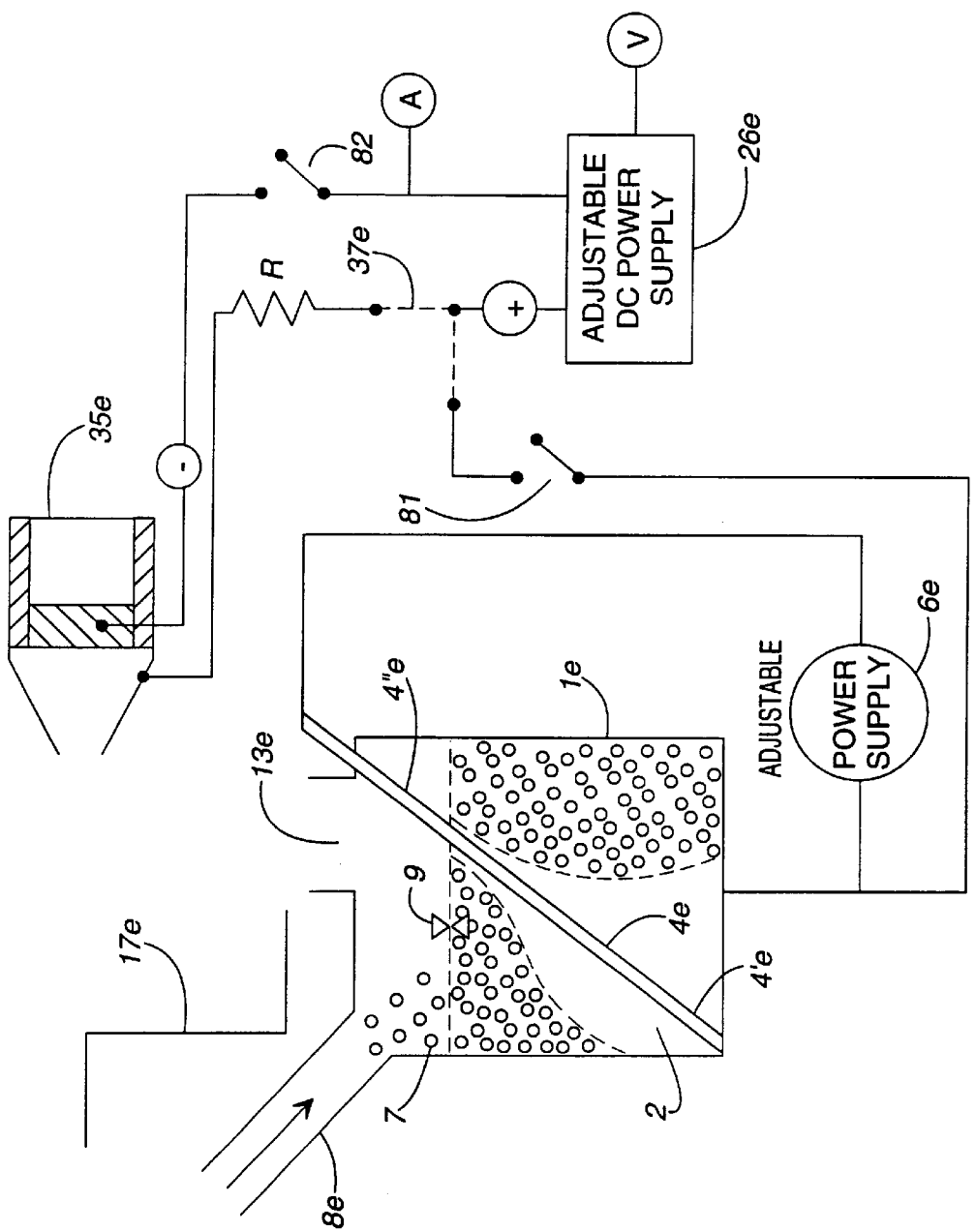

FIG. 1E shows a means of avoiding the need for an evaporating crucible, particularly where the evaporative material 2 is nearly electrically non-conducting in the cold solid state, but gradually increases its conductivity as the solid is heated and further increases its conductivity in the molten state as in the case of silicon. Solid pellets 7 are fed to melting crucible 1e via chute 8e so as to maintain an approximate pellet level 9e. An electrical circuit is formed between an adjustable power supply 6e, via a switch 81 and via an electrically conductive evaporative element or rod 4e, which is in contact with the base of crucible 1e. The rod 4e is heated by the current in the said electrical circuit and can therefore melt the solid pellets 7 of material 2 in contact with it. The rod 4e therefore maintains a pool of molten material 2 in its immediate vicinity and near its base (as indicated in FIG. 1E) and this pool is surrounded by solid pellets 7.

Suitable material for making the conductive rod 4e depends on the composition of the evaporative material 2 to be melted. Generally, material which is suitable for making the melting crucible 1e is suitable for making the conductive rod 4e. Desirably therefore, the conductive rod 4e is made of material which is substantially inert to the evaporative material 2 at the conditions under which the evaporative material is melted and evaporated. When the evaporative material 2 is silicon, the conductive rod 4e is desirably carbon.

Depending on the characteristics of the evaporative material 2, it may at start-up be necessary to produce an initial melt of material 2 by means of an external heating source. When this start-up need for melting arises, the solid pellets 7 can initially be melted either by means of an arc which can be generated by a cathode 35e which is connected via a power supply 26e to the melting crucible 1e, or by the heater and power supply means already described under FIG. 1a to 1d. Where an arc is to be used this can be achieved by switching the electrode 35e, which is similar to electrode 35 as shown and described with FIG. 3 hereunder, to a negative polarity by means of closing switch 82 and forming an arc by discharging to the positive polarity of melting crucible 1e, by closing switch 81, and maintaining this arc until the solid pellets 7 have melted sufficiently to produce an initial pool of molten material 2. This pool of molten material 2 can then conduct sufficient heat to the mass of solid pellets 7 to ensure that the melting process can continue simply by the heat generated in rod 4e, and without the further need of an external heating source. From that point on, the electrode 35e can revert to its normal function and be used to produce a plasma in the manner described hereunder, since it is only needed for producing molten material 2 in the start-up phase. Electrode 20 as described hereunder with FIG. 2 can also be temporarily switched in the start-up phase to produce molten material 2 by connecting one of the electrodes 20 via a switch so as to conform to the circuit shown for this purpose in FIG. 1e. The rod 4e can take the form of various other electrically conductive elements such as a plate or the like. Also, a plurality of rods 4e may be applied.

In the particular case of silicon, (or materials like silicon which exhibit a negatice temperature coefficient), the electrode system 35e may be used by means of switches 81 and 82 to heat or melt the solid pellets 7 whenever the electrical connection of rod 4e with the base of crucible 1e becomes inadequate. The heating using electrode 35e is maintained by means of switches 81 and 82 until the current flow through rod 4e restarts due to the electrical conduction of the silicon in the base of crucible 1e.

Depending on characteristics of material 2 and particularly in case of silicon, the electrical current flowing in rod 4e forces some molten material 2 to flow to its rod ends 4'e and 4"e, due to electromagnetic forces whereby 4"e is above level 9e. A thin film of molten material 2 flows up to rod-end 4"e, where it meets the hottest part of rod 4e, because this part must conduct the whole electrical current from power supply 6e in contrast to the parts of rod 4e which are in full contact with electrically-conducting molten material 2, such as in the case of rod-end 4'e, since the molten material 2 helps to augment the circuit. When the evaporative material 2 comes in contact with the hottest part of rod 4e (i.e. rod-end 4"e), it evaporates and the vapor is emitted from vapor releasing opening 13e. The power supply 6e to rod 4e is adjusted to give the required evaporation rate of material 2 and this maintains a quantity of molten material 2 in contact with rod 4e, which in turn maintains the electrical circuit and enables the evaporation to continue.

Electric Arc Discharge System With Polarity Switching Electrodes

Figure 2:
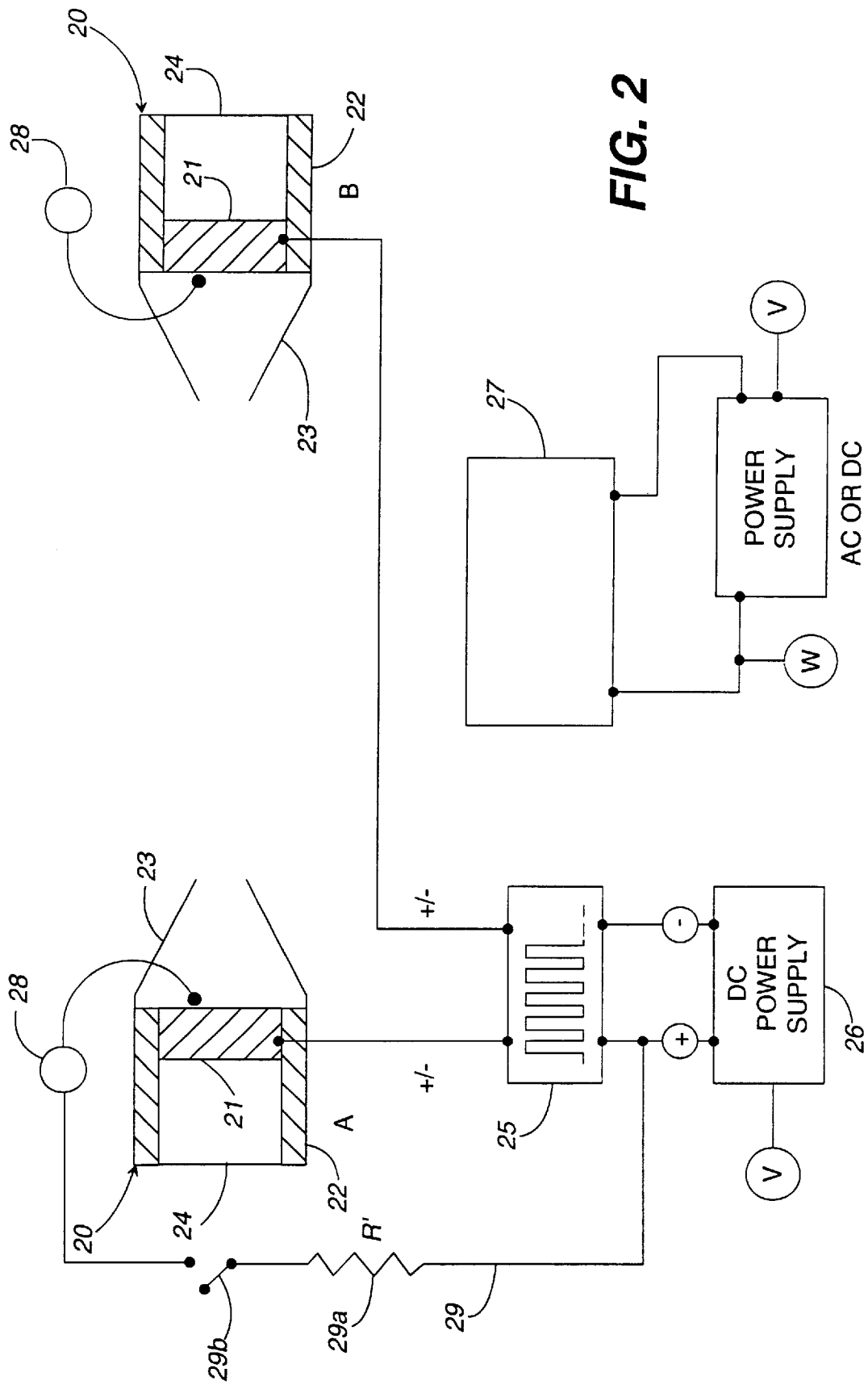
FIG. 2 is a schematic diagram of an evaporator system, made according to an embodiment of this invention, wherein vapor is energized to a plasma state by means of the arc generated by a pair of DC electrodes, whose relative polarity periodically alternates.

FIG. 2 illustrates an electric arc discharge apparatus including two identical electrodes 20 comprising a disc 21 of a suitable, coating process specific material to which a DC-potential is connected, an electrical insulating sleeve 22, a hood 23, and a cooling system 24, which comprises water-cooled chambers in good thermal contact with the disc 21.

The discs 21 of the electrodes 20 are connected to a switching system 25 which in turn is connected to an adjustable DC-power supply 26 whose energy output is regulated by conventional means. The switching system 25 enables the polarity (+or −) of the two electrodes to change, so that when one electrode A becomes negatively charged, i.e. cathodic, electrode B simultaneously becomes positively charged, i.e. anodic, and vice-versa.

In the cathodic (i.e. negative polarity state), a stream of electrons emerges from disc 21 and ionizes the vapor from evaporator system 27 to form a plasma. The discs 21 erode during the electric arc process and the rate of erosion is dependent on the material chosen. Since the eroded material passes to the gas phase, and is ionized to form a plasma within the space defined by hood 23 and disc 21, it mixes with the plasma formed from the vaporized particles from evaporation system 27. It is often desirable to choose the material of disc 21 such that its erosion particles can form a property-enhancing dopant within the coating. The compositions of the disks 21 of the two electrodes A and B can even be different so as to add multiple components to the coating vapor.

For example, in the case of deposition of a silicon oxide by evaporating silicon (or a silicon oxide) in evaporator system 27, it is often desirable to add dopants to the main coating supplied by evaporator system 27 through the addition of the erosion particles from disc 21. In. case of mainly silicon or silicon oxide coatings, useful dopants are disclosed in PCT International Application PCT/US98/05293, and these can either be alloyed within the basic material of disc 21 or disc 21 can be entirely composed of them. Common basic materials for disc 21 are brass and magnesium.

The material of the hood 23 should remain essentially inert to the electric arc discharge process and thus resist erosion and corrosion. For example, stainless steel is appropriate for many applications.

The electrodes A and B and an evaporator system 27 are disposed in a vacuum cell (such as in FIG. 6) which is capable of maintaining a vacuum. The evaporator system 27 produces a vapor from a solid either by a method as described by FIG. 1, or by any other means, such as the simple means of a conventional, heated crucible. The evaporator system 27 is positioned so that the vapor emerging from the evaporator system mainly passes through the gap between electrodes A and B. Since the electrodes A and B are oppositely charged, an electrical discharge occurs between them, and a plasma is formed consisting of the ions and electrons discharged from the discs 21, ionized material produced from vapor from evaporator system 27, and ionized reactive gases, if used. Reactive gas or gases (not shown) are fed into the space between electrodes A and B, when reactive gases are a necessary component of the coating. An example of the use of reactive gas is the application of oxygen as reactive gas with a silicon vapor in a vacuum cell to produce a transparent silicon dioxide coating and is described in U.S. patent application Ser. No. 08/818,342 filed by Plester et al and PCT International Application PCT/US98/05293, already incorporated by reference.

The detailed operation of electrodes A and B is as follows. When electrode A is to be the cathode and B is to be the anode, electrode A is switched to the negative polarity by switch 25 and electrode B to positive polarity. An electric discharge arc is formed between the two electrodes and disc 21 of electrode B gradually becomes coated with particles from the evaporator system 27 and disc 21. Meanwhile, disc 21 of electrode A begins to vaporize and erode due to the discharge of particles. The coating of disc 21 of electrode B with particles would lead to the disruption of the arc between the two electrodes if, as in case of silicon dioxide or silicon, the coating particles are electrically non-conducting. By switching polarity after a time, so that electrode B becomes cathodic and electrode A becomes anodic, disc 21 of electrode B commences to erode, and thus naturally cleans any deposits collected during its period as anode, whilst disc 21 of electrode A begins to receive a coating. The electrodes A and B are thus maintained free of insulating deposits by the switching of polarity, and the frequency of switching is adjusted to the particular process and to the requirement of maintaining a viable discharge arc.

The arc intensity, set up between electrodes A and B, and the degree of ionization of the vapor from the evaporator system 27 are regulated by the energy input of the electrode power-supply 26, which is independent of the power supply for the evaporator system. During the instant of polarity switching by switch 25, the arc set up between electrodes A and B may die out depending on the rapidity of switching. Each electrode A and B is fitted with an ignition system 28 which conventionally consists of a mechanically operated metal finger or electrically conductive element, which is connected by connection 29 to the anode of the DC power supply, and is made momentarily to touch disc 21 of the cathodic electrode at the instant of ignition, so as to recommence ignition and restart the discharge arc between the electrodes. Connection 29 can incorporate an electrical resistor 29a and a switch 29b, as required to control the ignition system.

Although only one evaporator 27 is shown in FIG. 2. it should be understood that the arrangement of electrodes A and B can be used to ionize vapors from a plurality of evaporators producing an ionized gas mixture from a variety of vapors of different composition.

Figure 2A:
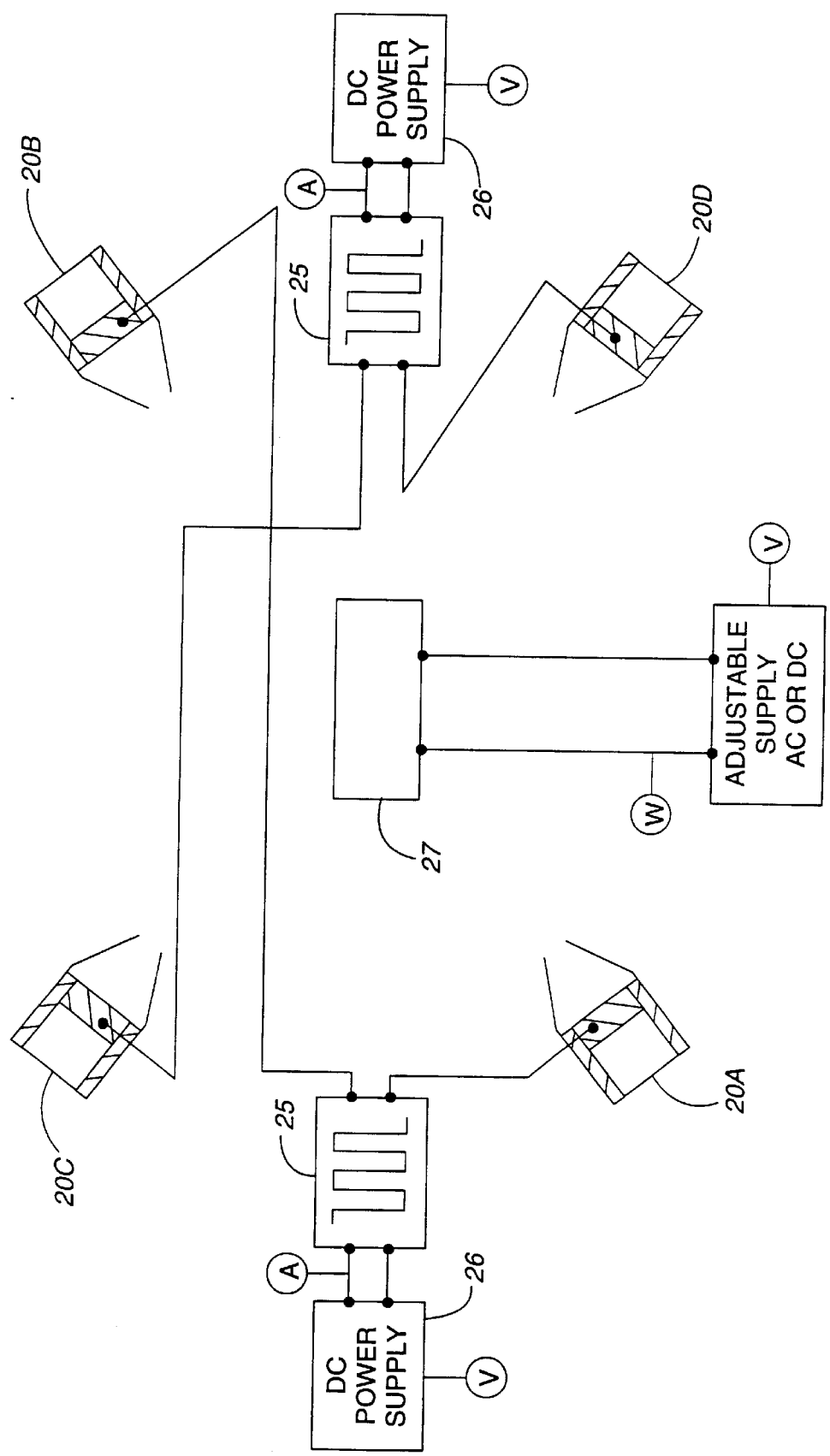
FIG. 2A is a schematic diagram of an evaporator system similar to that shown in FIG. 2, except with two pairs of electrodes whose relative polarity periodically alternates.

FIG. 2a shows an alternative arrangement to that of FIG. 2, which avoids the need for re-ignition when the electrodes 20 in the A and B positions of FIG. 2 switch polarity. On FIG. 2a, two sets of electrodes, denoted 20A, 20B and 20C, 20D, are employed and each set has a separate DC-power supply 26 and switching system 25. The switching of the two sets of electrodes is phased so that only one set is switching polarity at any instant, leaving the other set to maintain a plasma. By ensuring that the switching is rapid and that the electrodes are positioned close to the plasma cloud generated by evaporator system 27 and the electrodes 20 themselves, this plasma acts as re-ignition means for the electrodes.

It should be understood that although two pairs of electrodes are illustrated in FIG. 2a, more than two sets of electrodes could be used simultaneously provided that at least one pair of electrodes is generating an electric arc discharge at any time during operation.

Electric Arc Discharge System With Combined Anode/Cathode Electrode

Figure 3:
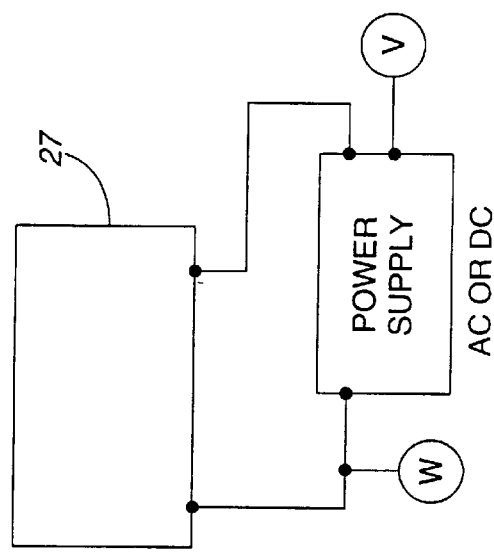
FIG. 3 is a schematic diagram of an evaporator system, made according to an embodiment of this invention, wherein vapor is energized to a plasma state by means of the discharge from a cathode/anode combination.
Figure 3:
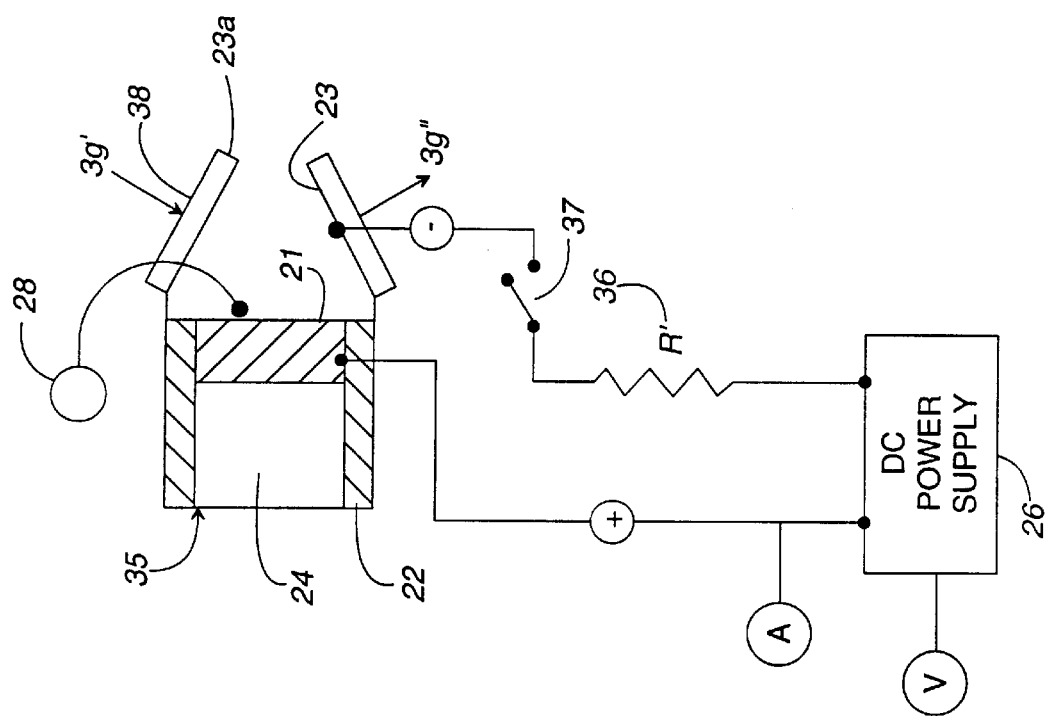

An alternative to the electric arc discharge apparatus described by FIG. 2 is shown in FIG. 3, which shows an electrode 35 comprising a disc 21, to which the cathodic terminal of a DC-power supply 26 is connected, an electrical insulating sleeve 22 for the disc 21, an anodic hood 23 in the shape of a tapered shell at least partially covering the disc, and a cooling system 24 for cooling the disk 21. The anodic terminal of the adjustable DC power supply 26 is connected via a fixed resistor 36 and a switch 37 to the anodic hood 23. The electrode 35 in FIG. 3 can be constructed identically to electrode 20 in FIG. 2 and the only difference in principle is the connection of the anodic hood 23 to the anodic terminal of power supply 26. Vapor is generated by an evaporator system 27 adjacent the electrode 35 in a vacuum cell (not shown). The function and embodiment of the evaporator system 27 follows the description already given for FIG. 2. In this embodiment, the anodic hood 23 has the function of shielding its own interior surface and the cathodic disk 21 from coating vapor emitted by the evaporator 27.

A cathodic discharge arc is established in an ionization chamber within the combined anode/cathode electrode 35 between the in-built cathode disc 21 and the integral, anodic hood 23. This discharge is emitted from the hood 23 through a plasma discharge opening 23a into the vapor rising from evaporator system 27, energizing this vapor, and forming a plasma which consists of ionized particles from disc 21, electrons from disc 21 and ionized particles within the vapor emitted by evaporator system 27. The degree of plasma enhancement can be regulated by the energy input of the power supply 26, which in turn is regulated by conventional means and is independent of the power supply for the evaporator 27.

Ignition can be by means of the ignition system 28, as already described under FIG. 2. However, the discharge from disc 21 forms a plasma which condenses and deposits within the anodic hood 23 when the combined electrode 35 is shut down. This deposit consists of electrically conducting particles, which bridge across the gap between disc 21 and hood 23, causing a short-circuit whenever the electrode 35 ceases to be energized.

When the energizing switch 37 is closed and energy is reapplied to electrode 35, there is a momentary short-circuit between the cathodic disc 21 and the anodic hood 23 enabling ignition. The short-circuit does not persist because the deposit bridging the cathodic disc 21 with the anodic hood 23 re-evaporates immediately after ignition, and this permits electrode 35 to ignite and commence normal operation.

Although only one evaporator 27 is shown in FIG. 3, it should be understood that the combined anode/cathode electrodes 35 can be used to ionize vapors from a plurality of evaporators producing a variety of vapors of different composition. The temperature increase in the ionization chamber formed by the disk 21 and the anodic hood 23 can rise to a point where the anodic hood erodes significantly. The erosion of the anodic hood 23 can be reduced or prevented by cooling the outside of the anodic hood, for example, by means of a water jacket 38 and inlet and outlet water flows 39' and 39".

Continuously Fed Electrode

FIG. 4 shows an embodiment of an electric arc discharge apparatus, as already described in the case of electrodes 20 and 35, where the erodable component can be continuously replaced and comprises an electrode member 21a in the form of a bar or rod which can be continuously replaced by a plurality of electrode members 21a and which is identical in operating principle to the disc 21 in FIGS. 2 and 3. This continuously fed electrode is particularly advantageous when the electrode members 21a are composed of a material which quickly vaporizes during electric arc discharge. Materials for the electrode members 21a which quickly vaporize or erode are often beneficial because they help energize, ionize, and enhance the plasma. Particularly, for plasma enhancement of silicon vapor mixed with a reactive gas such as oxygen, the use of rapidly eroding materials, such as zinc, brass and magnesium have been found to be very beneficial to the barrier properties of a coating on PET-bottles, as reported in PCT International Application PCT/US98/05293.

Each electrode member 21a is continuously fed, in series, from a housing 59 defining a loading chamber so that one of the plurality of electrode members is fed to an electric arc discharge position E at a time. As each one of the electrode members is fed to the electric arc discharge position E, the one electrode member being fed is gripped between two water-cooled, semi-circular cold segments 40a and 40b. The cold segments 40a and 40b are served by flexible cooling water pipes 41, and are mounted on two arms 42a, 42b which are held by a hinge 43 and forced together or apart, when desired, by conventional mechanical means 44 (not shown in detail) which could involve a conventional electrically activated piston, or similar mechanism. The two cold segments 40a, 40b and the two arms 42a, 42b are in electrical contact with the cathodic terminal of a DC power supply 26, as already described. Hinge 43 is connected to a support bracket (not shown), which itself is mounted in an electrically insulated manner.

The hood 23, already described in conjunction with FIGS. 2 and 3, is split into 2 halves, forming a split-hood 45 and the two halves of split-hood 45 are mounted via electrically insulating mountings on arms 42a, 42b, so that one half of the split-hood 45 is mounted on each arm 42a and 42b and the two halves of the split-hood come together to form a complete hood when the arms 42a, 42b are forced together by mechanical means 44. The split hood 45 is arranged to form an ionization chamber into which the electrode members 21a are fed. For the sake of clarity, split-hood 45 is shown in broken lines in FIG. 4. to avoid over-complicating the presentation.

Each electrode member 21a, as it is fed to the discharge position E, is held in an insulating sleeve 46, which is constructed of an inert, insulating, high temperature tolerant material, such as glass or ceramic, and is supported, along with the housing 59 by a bracket 47. The rearward end of the electrode member 21a being fed to the discharge position E is pressed against a piston 48 which can be moved by a drive means 49. As the electrode member 21a erodes, arms 42a, 42b open periodically at fixed time intervals, determined by the process and the rate of erosion of the electrode member, and drive means 49 pushes the electrode member 21a in direction B by an amount which compensates for the erosion. Erosion rates of the electrode member 21a can be accurately determined by proper control of current from power supply 26 and of material purity of the electrode member 21.

A magazine 50 holds numerous unused electrode members 21*a*. Stops 51 hold the stack of unused discs 21 and allow one unused electrode member 21 to enter position C when a positioner 52 on drive means 49 determines that drive means 49 has advanced to a point where position C is clear and therefore can accommodate a replacement electrode member 21*a*. At that point, stops 51 are opened by activators 53 and allow just one replacement electrode member 21 to drop into position C. Stops 51 and activators 53 together form a conventional feed escapement, and will not be described further.

The electrode members 21*a* have a protrusion 54 on the rearward end and a matching cavity 55 on the forward end, as marked by direction B, such that the protrusion and cavity fit and grip together when pushed by piston 48. When position C is free to receive a replacement electrode member 21*a*, as detected by positioner 52, the drive means 49 withdraws in direction D to make space for the replacement electrode member 21*a* which is then allowed by stops 51 to fall into position C. Drive means 49 then advances to push replacement disc 21*a* till the cavity 55 on its front end engages and locks with the protrusion 54 on the rearward end of the particular electrode member 21*a* which is in actual use at that time in the discharge position E. Thereafter, the drive means 40 continues periodically to advance the electrode member 21*a* to keep pace with erosion, in the manner already described.

Figure 4B:
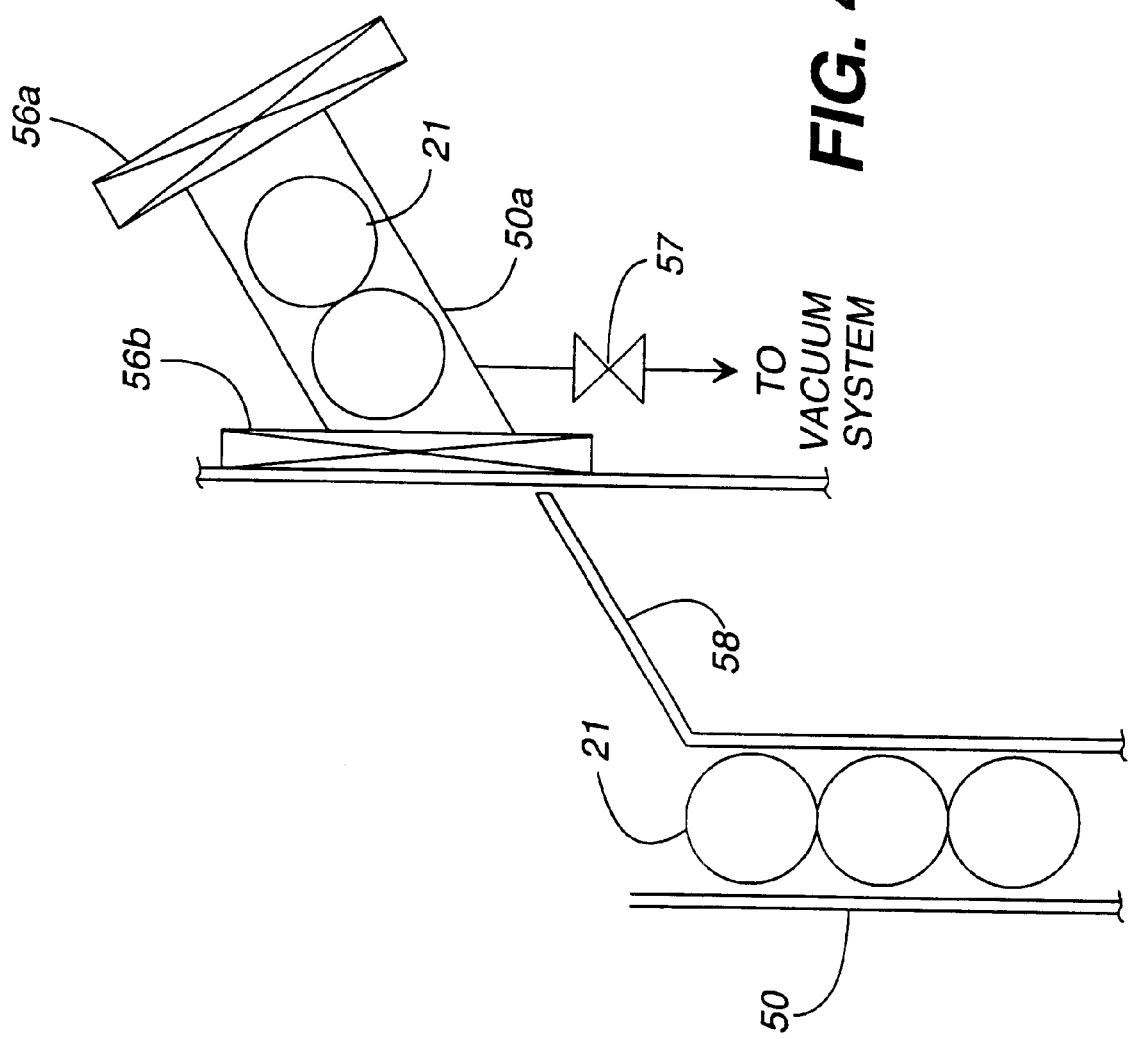
FIG. 4B is a schematic diagram of an electrode member feeder for the continuously fed electrode illustrated in FIG. 4.

The system described by FIG. 4 is intended to be mounted within a high vacuum enclosure and the magazine 50 can be refilled during maintenance shutdowns. As shown in FIG. 4B, the magazine 50 can also be fed from outside the vacuum enclosure by providing an evacuation cell 50*a* located in communication with the vacuum enclosure and consisting of a separate chamber which can be sealed by two doors 56*a*, 56*b*. During refilling of the magazine 50, the separate evacuation cell 50*a* is brought to atmospheric pressure by closing door 56*b* and opening door 56*a*. The evacuation cell 50*a* is then filled with electrode members 21. Door 56*a* of the second compartment 50*a* is then closed and the second compartment 50*a* evacuated by operating valve 57. When the second compartment 50*a* has been evacuated, door 56*b* is opened and electrode members 21 are allowed to roll in a controlled manner down a chute from compartment 50*a* to compartment 50. This procedure can be repeated indefinitely, without the main vacuum enclosure being vented.

The system described in FIG. 4, 4A, and 4B, can be used as a continuously fed means instead of electrode 20 in FIG. 2, or electrode 35 in FIG. 3, when a continuous feed is required.

System and Apparatus for Measuring Rate of Evaporation and Degree of Ionization FIG. 5 shows a means of continuously measuring the rate of evaporation from an evaporator system 27, whether evaporator system 27 is a simple, electrically heated crucible or a continuously fed system as described by FIG. 1, or a cathodic-arc-heated crucible as in PCT International Application PCT/US98/05293. FIG. 5 also shows a means of measuring the degree of ionization within the plasma. For the function of the evaporation rate and ionization degree measuring device in FIG. 5, the plasma can be generated by an electric arc discharge apparatus such as illustrated in FIGS. 2, 3, or 4, or by other means. In the example shown in FIG. 5, the plasma making means actually shown is the combined anode/cathode electrode 35 by way of example only. As well as measuring the two said operating factors, rate of evaporation and degree of ionization, these said factors can be regulated, using the measurement data, either automatically or manually. In principle, the rate of evaporation can be regulated by the conventionally adjustable energy input of power supply of the evaporator system 27 and the degree of ionization can be regulated by the conventionally adjustable energy input of the power supply 26 of the electrode 35.

The measuring device in FIG. 5 includes an electrically conductive element which is a wire 60, supported in an appropriate position within a vacuum vapor deposition coating chamber by an electrically insulated support 61. The electrically conductive element 60 could be another type of conductive member such as a plate or rod. The wire 60 is connected to a power supply 62 via a switch 63. When the switch 63 is closed, the wire 60 is heated, and when the switch 63 is open, the wire 60 cools. The switch 63 is opened/closed by a timer 64 which controls the open/close sequence appropriately. The wire 60 is placed within and exposed to the plasma to be measured and controlled. When the wire 60 is heated, deposited particles from source 27 are evaporated and removed from the surface of wire 60 and when wire 60 is not heated, deposited particles build up on its surface. A DC-power source 65 is connected via an ammeter 66 to the wire 60 and forms a circuit via the ionized particles from source 27 and via the inside of the walls of the vacuum cell 70 to ground, whereby the current generated in this circuit is related to the electrical resistance of the plasma and thus to the degree of ionization.

The I/U (current/voltage) diagram (see FIG. 5A) shows that the degree of ionization is proportional to the current (I) generated. As the wire 60. is coated with solid particles from the plasma, if these are non-electrically conducting, as for example in case of a silica coating process, the I/U curve is displaced (see chain-dotted curve in FIG. 5A). When the wire 60 is heated, deposits evaporate and/or are sputtered away, and within a fixed time period, the current reverts to being a measure of the degree of ionization (see solid-line curve in FIG. 5A). The fixed time period and the relationship between current and degree of ionization must be determined experimentally for the specific process. When a measurement of degree of ionization has been made, the heater circuit 67 is switched off by opening switch 63. This allows coating particles to build up on wire 60 and an evaporation rate measurement can begin. The rate of change of the current measured by ammeter 66 is related to the rate of deposition of non-electrically conducting particles onto wire 60, and this gives a measure of rate of evaporation. By alternating, therefore, from heating the wire 60 to not heating it, measurements of both rate of evaporation and degree of ionization can be made.

Figure 5B:
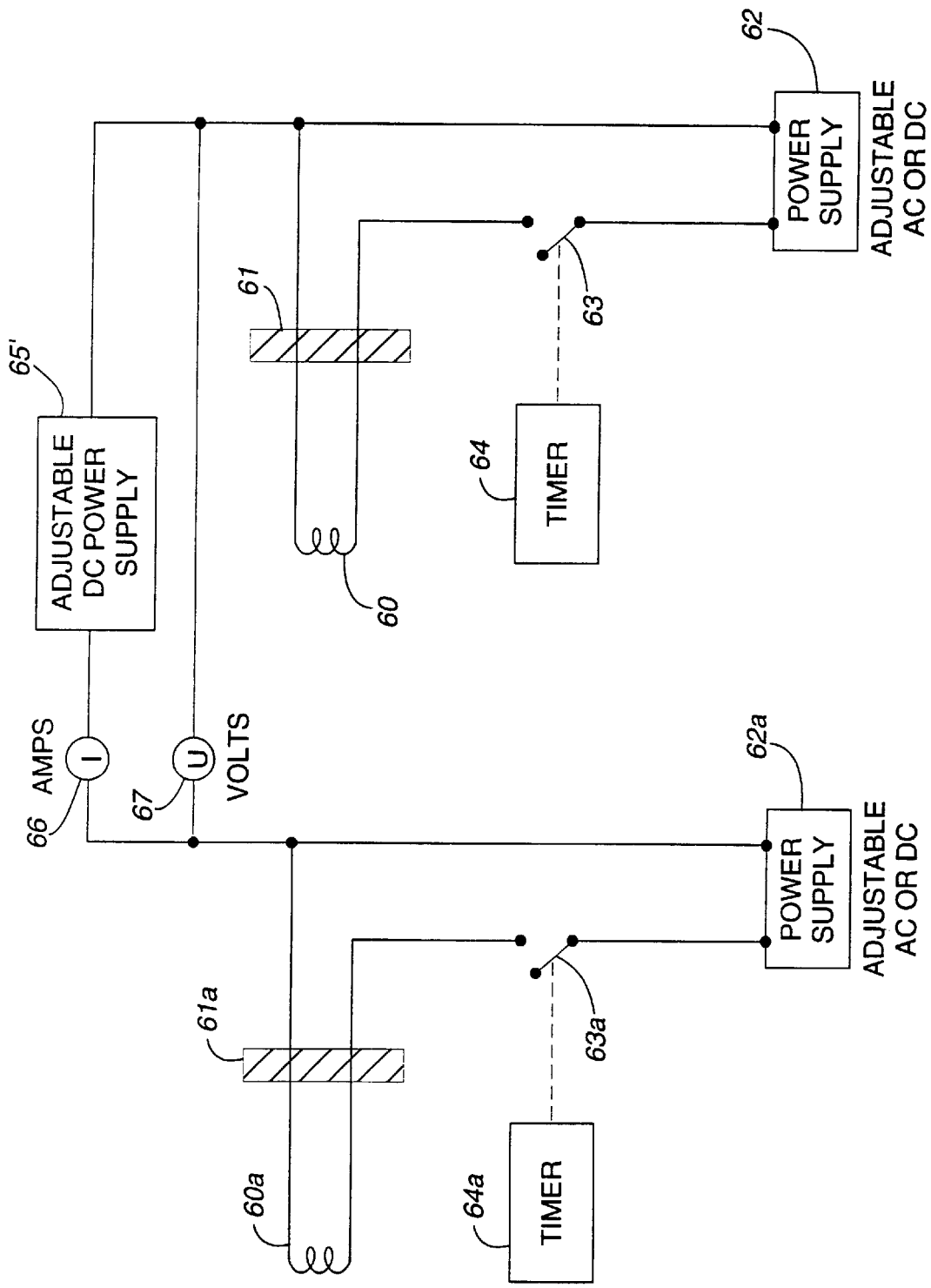
FIG. 5B is a schematic diagram illustrating an alternative system for measuring the rate of evaporation and degree of ionization within a vacuum vapor deposition coating system, in accordance with an embodiment of this invention.

In cases when the inside of the walls of the vacuum cell is quickly coated with non-electrically conducting material during the specific coating process, the measurement of current flow between wire 60 and the walls of the vacuum cell to ground via the ionized particles from source 27 is disrupted. A means of avoiding this disruption of the measurement circuit is shown in FIG. 5*b*. This includes a reference wire 60*a* with its own means of heating/cooling which are provided, as already described for wire 60 under FIG. 5, through power supply 62*a*, switch 63*a* and timer 64*a*. The measurement circuit now runs from AC or DC power source 65' to wire 60, via the ionized particles to wire 60*a* and back to power source 65'(the symmetrical use of similarly-sized wires 60*a* and 60 enables choice of AC or DC power supply). Wire 60*a* receives coating particles in the same way as the inner walls of the vacuum cell, but remains unaffected because these particles are removed during the heating cycle of wire 60a.

Self-Cleaning Vacuum Vapor Deposition System

Figure 6:
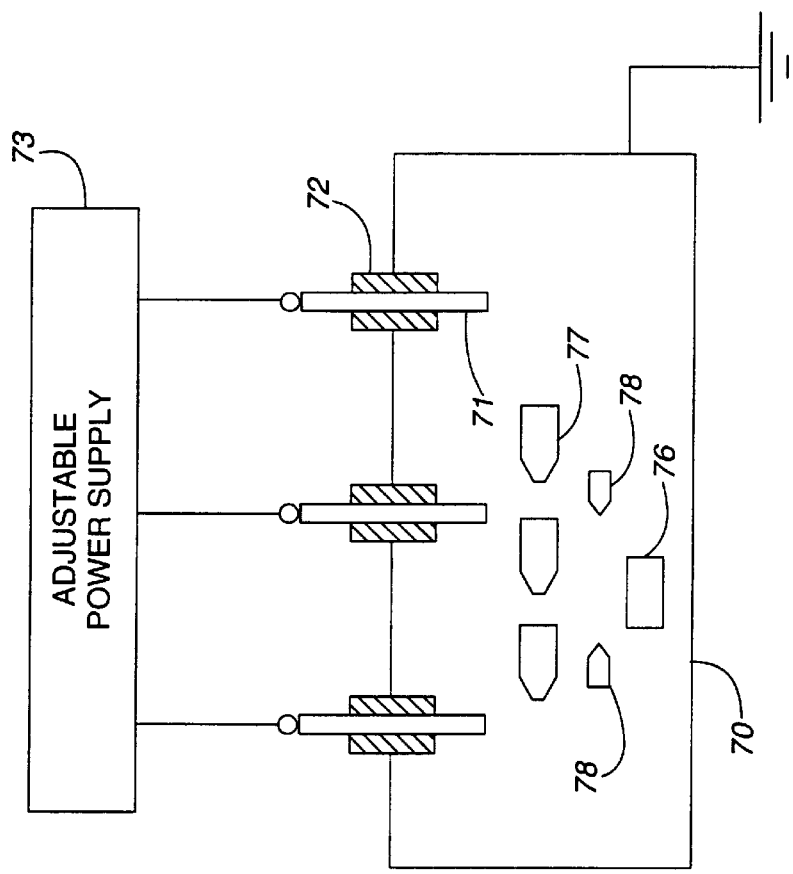
FIG. 6 is a schematic diagram of a vacuum chamber with several DC-discharge probes (or alternatively RF or HF antennas) mounted within it, enabling discharge within the interior of the vacuum chamber, in accordance with an embodiment of this invention.

FIG. 6 shows a vacuum cell 70 for coating articles by the processes described above, and illustrates, in schematic form, an evaporator source 76, such as illustrated in FIG. 1, or another source of coating vapor, an article to be coated, i.e. coating substrate 77, plasma making electrodes 78 such as those disclosed in FIGS. 2–4, and a device 80 for measuring process parameters as illustrated in FIG. 5, all disposed in the vacuum cell. It is well known that the internals of vacuum coating enclosures gradually become coated with misdirected coating particles and that such unwanted coating of equipment can severely affect coating performance, particularly the performance of the vacuum system, because the misdirected particles which coat the equipment surfaces trap water vapor and other volatiles. This necessitates frequent shut-down for maintenance cleaning.

Several probes 71 are located within the vacuum enclosure 70, mounted insulating-sleeves 72 and connected to an ionizing power supply 73. Depending on the process and the type of coating being applied, the power supply 73 can be HF, or RF, or DC. Sufficient power must be supplied by the power supply 73 to cause the gas in the vacuum enclosure 70 to ionize. The process of ionizing the gas in enclosure 70 quickly vaporizes deposits within the enclosure 70 and burns these up when they are combustible (as for example, organic deposits due to condensation of vapor emanating from plastic substrates). This reduces the frequency of the need to undertake more time consuming and labor intensive cleaning. This cleaning process, using strategically mounted probes 71 throughout the vacuum enclosure 70, can be ignited periodically, normally without interrupting the coating process. Alternatively, it can be applied during brief shut-downs of the coating process, particularly where the cleaning of the inside of vacuum enclosure 70 can be enhanced by increasing pressure, typically in the range from 1 to $10^{-2}$ mbar. The material of probes 71 must be suitable for the chosen form of power supply (HF or RF or DC) and resist corrosion under the process conditions in enclosure 70. Examples of suitable materials are stainless steel, copper and titanium.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for measuring the degree of ionization in a vapor deposition coating system which comprises an ionized vapor enclosure, an evaporator for producing coating vapor in the ionized vapor enclosure, and an ionizing source for ionizing the coating vapor to a degree of ionization, comprising the steps of:

exposing a first electrically conductive element and a second electrically conductive element to the ionized coating vapor in the ionized vapor enclosure;

supplying electric current to the first electrically conductive element with a first electric power supply so that the electric current flows from the first electric power supply, through the first electrically conductive element, through the ionized vapor to the second electrically conductive element, through second electrically conductive element, and back to the first electric power supply; and measuring electric current through the first electrically conductive element with an ammeter.

2. A method as in claim 1 wherein the first and second electrically conductive elements are wires.

3. A method for measuring the rate of evaporation from an evaporator in a vapor deposition coating system which comprises an ionized vapor enclosure, the evaporator for producing coating vapor in the ionized vapor enclosure at a rate of evaporation, and an ionizing source for ionizing the coating vapor to a degree of ionization, comprising the steps of:

exposing an electrically conductive element to the ionized coating vapor;

supplying electric current from a first power supply to the electrically conductive element and closing a first circuit including the electrically conductive element and the first power supply to heat the electrically conductive element and evaporate from the electrically conductive element particles deposited on the electrically conductive element from the coating vapor;

opening the first circuit; and thereafter while supplying electric current to the electrically conductive element with a second electric power supply, measuring the rate of change of the electric current through the electrically conductive element and the ionized coating vapor to ground with an ammeter.

4. A method as in claim 3 wherein the second electric power supply is a DC power supply.

5. A method as in claim 3 wherein the electric current supplied to the electrically conductive element by the second power supply flows from the electrically conductive element to the ionized vapor enclosure and to ground.

6. A method as in claim 3 wherein the electrically conductive element is a wire.

7. A method for measuring the rate of evaporation from an evaporator in a vapor deposition coating system which comprises an ionized vapor enclosure, the evaporator for producing coating vapor in the ionized vapor enclosure at a rate of evaporation, and an ionizing source for ionizing the coating vapor to a degree of ionization, comprising the steps of:

exposing a first electrically conductive element and a second electrically conductive element to the ionized coating vapor;

supplying electric current to the first electrically conductive element and closing a first circuit including the first electrically conductive element to heat the first electrically conductive element and evaporate from the first electrically conductive element particles deposited on the first electrically conductive element from the coating vapor;

supplying electric current to the second electrically conductive element and closing a second circuit including the second electrically conductive element to heat the second electrically conductive element and evaporate from the second electrically conductive element particles deposited on the second electrically conductive element from the coating vapor;

opening the first and second circuits; and thereafter while supplying electric current to the first and second electrically conductive elements, measuring the rate of change of the electric current passing through the first electrically conductive element, the ionized vapor, and the second electrically conductive element with an ammeter.

* * * * *